United States Patent
Shin

(10) Patent No.: US 8,068,072 B2
(45) Date of Patent: Nov. 29, 2011

(54) DATA DRIVER AND ORGANIC LIGHT EMITTING DIODE (OLED) DISPLAY USING THE SAME

(75) Inventor: Dong Yong Shin, Seoul (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 972 days.

(21) Appl. No.: 11/797,717

(22) Filed: May 7, 2007

(65) Prior Publication Data

US 2007/0262935 A1  Nov. 15, 2007

(30) Foreign Application Priority Data

May 9, 2006  (KR) .................. 10-2006-0041473

(51) Int. Cl.
G09G 3/30  (2006.01)
(52) U.S. Cl. .......................... 345/76; 341/155
(58) Field of Classification Search ............ 345/76, 345/100; 341/144, 155
See application file for complete search history.

(56) References Cited

U.S. PATENT DOCUMENTS

| 2003/0146896 | A1* | 8/2003 | Sekine | 345/98 |
| 2004/0090400 | A1* | 5/2004 | Yoo | 345/76 |
| 2004/0222999 | A1 | 11/2004 | Choi et al. | |
| 2004/0263437 | A1* | 12/2004 | Hattori | 345/76 |
| 2004/0263506 | A1* | 12/2004 | Koyama et al. | 345/204 |
| 2005/0107140 | A1 | 5/2005 | Kim | |
| 2006/0146001 | A1* | 7/2006 | Minami | 345/100 |
| 2006/0176200 | A1* | 8/2006 | Lin et al. | 341/144 |

FOREIGN PATENT DOCUMENTS

| KR | 10-2003-0086487 | 11/2003 |
| KR | 10-2003-0089417 | 11/2003 |
| KR | 10-2004-0096273 | 11/2004 |
| KR | 10-2005-0111919 | 11/2005 |

OTHER PUBLICATIONS

Inukai, Kazutaka, et al., Late-News Paper: 4.0-in. TFT-OLED Displays and a Novel Digital Driving Method, SID 00 Digest, pp. 924-927, (2000).

* cited by examiner

*Primary Examiner* — Quan-Zhen Wang
*Assistant Examiner* — Calvin C Ma
(74) *Attorney, Agent, or Firm* — Lee & Morse, P.C.

(57) ABSTRACT

A data driver includes a shift register circuit configured to receive a first clock signal, a second clock signal, and a start signal, and to sequentially provide a sampling signal, a conversion circuit configured to receive the first clock signal, the second clock signal, and the sampling signal, and to sequentially provide a conversion signal, a sampling latch circuit configured to store data according to the sampling signal and the conversion signal, and a holding latch circuit configured to receive the data from the sampling latch circuit in response to first and second enable signals, and to provide a first data signal or a second data signal to data lines corresponding to the received data.

26 Claims, 11 Drawing Sheets

DATA DRIVER AND ORGANIC LIGHT EMITTING DIODE (OLED) DISPLAY USING THE SAME

BACKGROUND OF THE INVENTION

1. Field of the Invention

The present invention relates to a data driver and an organic light emitting diode (OLED) display using the same. More particularly, the present invention relates to a data driver including PMOS transistors and a digitally driven OLED display using the same.

2. Description of the Related Art

Recently, various flat panel displays exhibiting reduced weight and volume, which are disadvantages of cathode ray tubes (CRTs), have been developed. Flat panel displays include, e.g., liquid crystal displays (LCDs), field emission displays (FEDs), plasma display panels (PDPs), and OLED displays.

The OLED displays make use of organic light emitting diodes that emit light by re-combination of electrons and holes. The OLED display has advantages of high response speed and low power consumption.

The OLED display may include pixels, a data driver, and a scan driver. The pixels may be arranged in a matrix. The data driver may drives data lines that are connected to the pixels, and the scan driver may drive scan lines that are also connected to the pixels.

The data driver may provide a data signal corresponding to data every horizontal time period, thereby causing the pixels to display a predetermined image. The scan driver may sequentially provide a scan signal every horizontal time period to select pixels to which the data signal is provided.

As a size of OLED display is increased, it may be desirable to form the data driver on the OLED panel in order to reduce the size, weight, and manufacturing cost thereof. However, because a conventional data driver is composed of PMOS transistors and NMOS transistors, it is difficult to form such a data driver on the panel. Accordingly, there is a demand for a data driver that is formed of PMOS transistors.

SUMMARY OF THE INVENTION

The present invention is therefore directed to a data driver and organic light emitting diode (OLED) display using the same, which substantially overcome one or more of the problems due to the limitations and disadvantages of the related art.

It is therefore a feature of an embodiment of the present invention to provide a data driver suitable for use as a digital driver, and which may be implemented using PMOS transistors.

It is therefore another feature of an embodiment of the present invention to provide an OLED display having a data driver mounted on a panel.

At least one of the above and other features and advantages of the present invention may be realized by providing a data driver, including a shift register circuit configured to receive a first clock signal, a second clock signal, and a start signal, and to sequentially provide a sampling signal, a conversion circuit configured to receive the first clock signal, the second clock signal, and the sampling signal, and to sequentially provide a conversion signal, a sampling latch circuit configured to store data according to the sampling signal and the conversion signal, and a holding latch circuit configured to receive the data from the sampling latch circuit in response to first and second enable signals, and to provide a first data signal or a second data signal to data lines corresponding to the received data.

The conversion circuit may be configured to output a conversion signal having a level opposite to a level of the sampling pulse during a low level half-cycle of the first clock signal, and the conversion circuit may be configured to maintain the output conversion signal at a same level during a next high level half-cycle of the first clock signal.

The sampling latches may be configured to receive the data when a low level sampling signal is provided thereto, and the sampling latches may be configured to output the data when a high level sampling signal and a high level conversion signal are provided thereto.

The sampling latches may be configured to store the data while the first enable signal is at a high level, the holding latches may be configured to receive the data from the sampling latches when the first enable signal is at a low level, and the holding latches may be configured to provide the first data signal or the second data signal when the first enable signal is at a high level.

The shift register circuit may include a plurality of shift registers, the sampling latch circuit may include a plurality of sampling latches, and the holding latch circuit may include a plurality of holding latches.

Each of the shift registers, the sampling latches, and the holding latches may include a same first circuit. Transistors in the first circuit may all be PMOS transistors.

The first circuit may include a capacitor and first, second, third, fourth and fifth transistors, wherein a first electrode of the first transistor is connected to an external input, a gate electrode of the first transistor is connected to a second input, and a second electrode of the first transistor is connected to a first node, a gate electrode of the second transistor is connected to the first node, a first electrode of the second transistor is connected to a first input, and a second electrode of the second transistor is connected to an output, a gate electrode of the third transistor is connected to the second input, a first electrode of the third transistor is connected to a second node, and a second electrode of the third transistor is connected to a fourth power supply, a gate electrode of the fourth transistor is connected to the first node, a first electrode of the fourth transistor is connected to the second input, and a second electrode of the fourth transistor is connected to the second node, a gate electrode of the fifth transistor is connected to the second node, a first electrode of the fifth transistor is connected to a third power supply, and a second electrode of the fifth transistor is connected to the output, and a first electrode of the capacitor is connected to the gate electrode of the second transistor, and a second electrode of the capacitor is connected to the second electrode of the second transistor.

The first, second, third, fourth, and fifth transistors may be PMOS transistors.

The shift register circuit may include even and odd shift registers, the first clock signal may be provided to the first input of the odd shift registers, the second clock signal may be provided to the second input of the odd shift registers, the first clock signal may be provided to the second input of the even shift registers, and the second clock signal may be provided to the first input of the even shift registers.

The shift registers may be configured to charge the capacitor with a voltage corresponding to a voltage provided to the external input when a low level voltage is provided to the second input, and the shift registers may be configured to provide a voltage corresponding to the voltage charged in the capacitor to the output when a high level voltage is provided to the second input.

The sampling signal may be provided to the second input of the sampling latches, and the conversion signal may be provided to the first input of the sampling latches.

The first circuit may include a capacitor and first, second, third, fourth and fifth transistors, wherein a first electrode of the first transistor is connected to an external input, a gate electrode of the first transistor is connected to a second input, and a second electrode of the first transistor is connected to a first node, a gate electrode of the second transistor is connected to the first node, a first electrode of the second transistor is connected to a first input, and a second electrode of the second transistor is connected to an output, a first electrode of the third transistor is connected to a second node, and a second electrode of the third transistor is connected to a gate electrode of the third transistor, a gate electrode of the fourth transistor is connected to the first node, a first electrode of the fourth transistor is connected to the second input, and a second electrode of the fourth transistor is connected to the second node, a gate electrode of the fifth transistor is connected to the second node, a first electrode of the fifth transistor is connected to a third power supply, and a second electrode of the fifth transistor is connected to the output, and a first electrode of the capacitor is connected to the gate electrode of the second transistor, and a second electrode of the capacitor is connected to the second electrode of the second transistor.

The conversion circuit may include an input circuit connected to an output circuit, the input circuit may be configured to control a voltage provided to the output circuit in correspondence with the sampling signal, and the output circuit may be configured to control output of the conversion signal in correspondence with the sampling signal and the voltage provided by the input circuit. Transistors in the input circuit and the output circuit may all be PMOS transistors.

The output circuit may include an eleventh capacitor, a twelfth capacitor, and eleventh, twelfth, thirteenth, fourteenth and fifteenth transistors, wherein a gate electrode of the eleventh transistor is connected to a third power supply, and a second electrode of the eleventh transistor is connected to an output, a gate electrode of the twelfth transistor is connected to the output, and a second electrode of the twelfth transistor is connected to a fourth power supply, a gate electrode of the thirteenth transistor is connected to a gate electrode of the eleventh transistor, and a first electrode of the thirteenth transistor is connected to the second electrode of the eleventh transistor, a first electrode of the fourteenth transistor is connected to the second electrode of the thirteenth transistor, a second electrode of the fourteenth transistor is connected to the fourth power supply, and a gate electrode of the fourteenth transistor is connected to the input circuit, a first electrode of the fifteenth transistor is connected to a third input, a second electrode of the fifteenth transistor is connected to the gate electrode of the eleventh transistor, and a gate electrode of the fifteenth transistor is connected to the first input, a first electrode of the twelfth capacitor is connected to the gate electrode of the eleventh transistor, and a second electrode of the twelfth capacitor is connected to the first electrode of the eleventh transistor, and a first electrode of the eleventh capacitor is connected to the gate electrode of the twelfth transistor, and a second electrode of the eleventh capacitor is connected to the first electrode of the twelfth transistor.

The data driver may further include a fourteenth capacitor, wherein a first electrode of the fourteenth capacitor is connected to the output, and a second electrode of the fourteenth capacitor is connected to the fourth power supply.

The input circuit may include a thirteenth capacitor and sixteenth, seventeenth, and eighteenth transistors, wherein a first electrode of the sixteenth transistor is connected to a gate electrode of the fourteenth transistor, and a second electrode of the sixteenth transistor is connected to the first input, a first electrode of the seventeenth transistor is connected to a gate electrode of the sixteenth transistor, and a gate electrode and a second electrode of the seventeenth transistor are connected to a second input, a gate electrode of the eighteenth transistor is connected to the third input, a first electrode of the eighteenth transistor is connected to the third power supply, and a second electrode of the eighteenth transistor is connected to the gate electrode of the sixteenth transistor, and a first electrode of the thirteenth capacitor is connected to the gate electrode of the sixteenth transistor, and a second electrode of the thirteenth capacitor is connected to the first electrode of the sixteenth transistor. The eleventh, twelfth, thirteenth, fourteenth, fifteenth, sixteenth, seventeenth, and eighteenth transistors may be PMOS transistors.

The conversion circuit may include even and odd conversion circuits, the first clock signal may be provided to the first input of the odd conversion circuits, the second clock signal may be provided to the second input of the odd conversion circuits, the first clock signal may be provided to the second input of odd conversion circuits, and the second clock signal may be provided to the first input of odd conversion circuits.

The input circuit may include a thirteenth capacitor and sixteenth, seventeenth, and eighteenth transistors, wherein a first electrode of the sixteenth transistor is connected to a gate electrode of the fourteenth transistor, and a second electrode of the sixteenth transistor is connected to the first input, a first electrode of the seventeenth transistor is connected to a gate electrode of the sixteenth transistor, and a gate electrode and a second electrode of the seventeenth transistor are connected to a second input, a gate electrode of the eighteenth transistor is connected to the third input, a first electrode of the eighteenth transistor is connected to the second input, and a second electrode of the eighteenth transistor is connected to the gate electrode of the sixteenth transistor, and a first electrode of the thirteenth capacitor is connected to the gate electrode of the sixteenth transistor, and a second electrode of the thirteenth capacitor is connected to the first electrode of the sixteenth transistor.

The input circuit may include a thirteenth capacitor and sixteenth, seventeenth, and eighteenth transistors, wherein a first electrode of the sixteenth transistor is connected to a gate electrode of the fourteenth transistor, and a second electrode of the sixteenth transistor is connected to the first input, a first electrode of the seventeenth transistor is connected to a gate electrode of the sixteenth transistor, a second electrode of the seventeenth transistor is connected to the fourth power supply, and a gate electrode of the seventeenth transistor is connected to a second input, a gate electrode of the eighteenth transistor is connected to the third input, a first electrode of the eighteenth transistor is connected to the second input, and a second electrode of the eighteenth transistor is connected to the gate electrode of the sixteenth transistor, and a first electrode of the thirteenth capacitor is connected to the gate electrode of the sixteenth transistor, and a second electrode of the thirteenth capacitor is connected to the first electrode of the sixteenth transistor.

The number of sampling latches may be three times the number of shift registers, and the number of holding latches may be three times the number of the shift registers. The sampling latches may include red sampling latches configured to store red data, green sampling latches configured to store green data, and blue sampling latches configured to store blue data. One red sampling latch, one green sampling latch, and one blue sampling latch may be configured as one group, and a same sampling signal and a same conversion signal may be provided to each of the red, green, and blue sampling latches of the one group. The holding latches may include red holding latches configured to receive the red data from the red sampling latches, the holding latches may include green holding latches configured to receive the green data from the green sampling latches, and the holding latches may include blue holding latches configured to receive the blue data from the blue sampling latches.

At least one of the above and other features and advantages of the present invention may also be realized by providing a digitally driven organic light emitting diode (OLED) display, including a scan driver configured to sequentially provide a scan signal to scan lines, a data driver configured to provide a first data signal or a second data signal to data lines, and a plurality of pixels, each pixel configured to be selected in response to the scan signal, to emit light in correspondence to a received first data signal, and to not emit light in correspondence to a received second data signal, wherein the data driver includes a shift register circuit configured to receive a first clock signal, a second clock signal, and a start signal, and to sequentially provide a sampling signal, a conversion circuit configured to receive the first clock signal, the second clock signal, and the sampling signal, and to sequentially provide a conversion signal, a sampling latch circuit configured to store data according to the sampling signal and the conversion signal, and a holding latch circuit configured to receive the data from the sampling latch circuit in response to first and second enable signals, and to provide the first data signal or the second data signal in correspondence with the received data.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
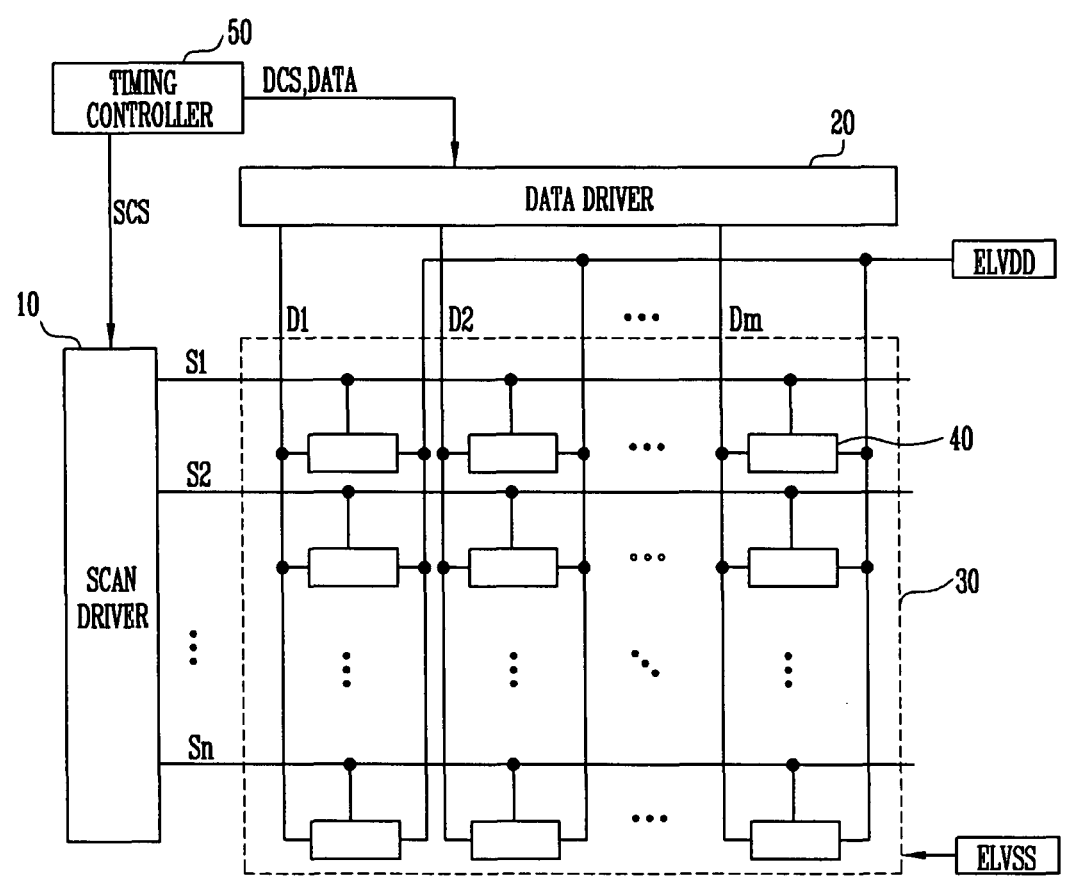
FIG. 1 illustrates an OLED display according to a first embodiment of the present invention.

Korean Patent Application No. 10-2006-0041473, filed on May 9, 2006, in the Korean Intellectual Property Office, and entitled: "Data Driver and Organic Light Emitting Diodes Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Where an element is described as being connected to a second element, the element may be directly connected to second element, or may be indirectly connected to second element via one or more other elements. Further, where an element is described as being connected to a second element, it will be understood that the elements may be electrically connected, e.g., in the case of transistors, capacitors, power supplies, nodes, etc. In the drawings, elements may be omitted for clarity. Like reference numerals refer to like elements throughout.

FIG. 1 illustrates an OLED display according to a first embodiment of the present invention. Referring to FIG. 1, the OLED display according to the first embodiment of the present invention may include a pixel region 30 having pixels 40, a scan driver 10, a data driver 20, and a timing controller 50. The pixels 40 may be connected to scan lines S through Sn and data lines D1 through Dm, where n and m are positive integers. The scan driver 10 may drive the scan lines S1 through Sn, and the data driver 20 may drive the data lines D1 through Dm. The timing controller 50 may control the scan driver 10 and the data driver 20.

The timing controller 50 may provide a data driving signal DCS and a scan driving signal SCS in correspondence to externally-provided synchronizing signals (not shown). The data driving signal DCS may be provided from the timing controller 50 to the data driver 20, and the scan driving signal SCS may be provided from the timing controller 50 to the scan driver 10. The timing controller 50 may also provide externally provided data DATA to the data driver 20.

The data driver 20 may provide a data signal to data lines D1 to Dm in each of a plurality of sub frames included in one frame. The data signal may be divided into a first data signal, which corresponds to a signal to pixel 40 to emit light, and a second data signal, which corresponds to a signal to pixel 40 not to emit light. Thus, the data driver 20 may provide a first data signal or a second data signal, respectively controlling emission or non-emission of the pixel 40, to data lines D1 to Dm during every sub frame time period.

The scan driver 10 may sequentially provide a scan signal to scan lines S1 to Sn during every sub frame period. When the scan signal is sequentially provided to the scan lines S1 to Sn, the pixels 40 may be sequentially selected by lines. The selected pixels 40 may receive the first data signal or the second data signal from the respective data lines D1 to Dm.

The pixel region 30 may receive power from a first power supply ELVDD and a second power supply ELVSS, which may be externally provided, and may provide the power to the pixels 40. After the pixels 40 receive the power of the first power supply ELVDD and the power of the second power supply ELVSS, when the scan signal is provided, the pixels 40 may receive a data signal, i.e., the first data signal or the second data signal, and emit light (or not) according to the data signal.

Figure 2:
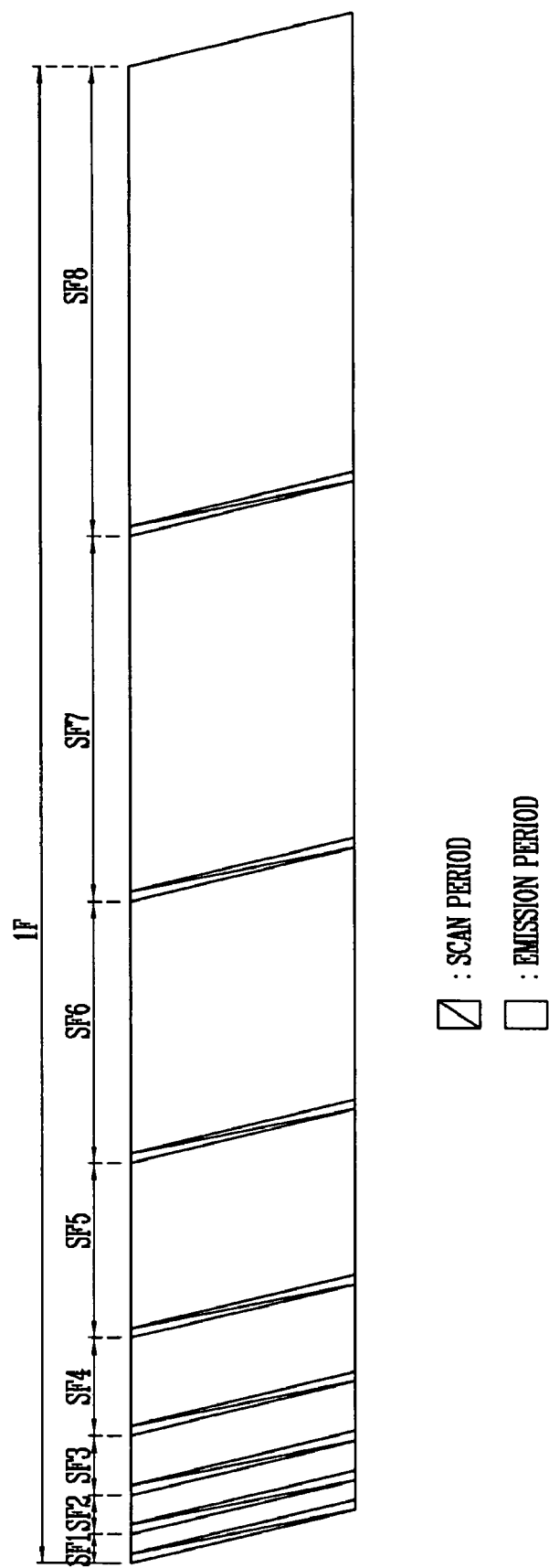
FIG. 2 illustrates one frame in an OLED display according to an embodiment of the present invention.

FIG. 2 illustrates a frame 1F in an OLED display according to an embodiment of the present invention. For convenience, FIG. 2 illustrates an exemplary frame 1F that is divided into 8 subframes SF1 to SF8. However, the present invention is not limited 8 subframes. Referring to FIG. 2, the frame IF in the OLED display according to an embodiment of the present invention may be divided into a plurality of sub frames SF1 to SF8 to be driven. Each of the sub frames SF1 to SF8 may include a scan period and an emission period to be driven.

During the scan period, the scan signal may be sequentially provided to the scan lines S1 to Sn. Further, a data signal may be provided to the data lines D1 to Dm in synchronization with the scan signal during the scan period. During the scan period, pixels 40 to be turned on according to the data signal may be selected.

During the emission period, the pixels 40 may emit light (or not) according to the data signal provided during the scan period. Here, scan periods of the respective subframes SF 1 to SF8 may be equal, whereas emission periods of the respective sub frames SF 1 to SF8 may be different. For example, the emission periods of the respective subframes SF1 to SF8 may increase as $2^0, 2^1, 2^2, 2^3, 2^4, 2^5, 2^6$, and $2^7$. Thus, the pixels 40 may emit light (or not) during the respective subframes SF1 to SF8 of the emission period, so as emit light of a predetermined gradation. Subframes included in one frame may be variously changed by, e.g., adding a reset period to the respective subframes, changing the emission periods of subframes, etc.

Figure 3:
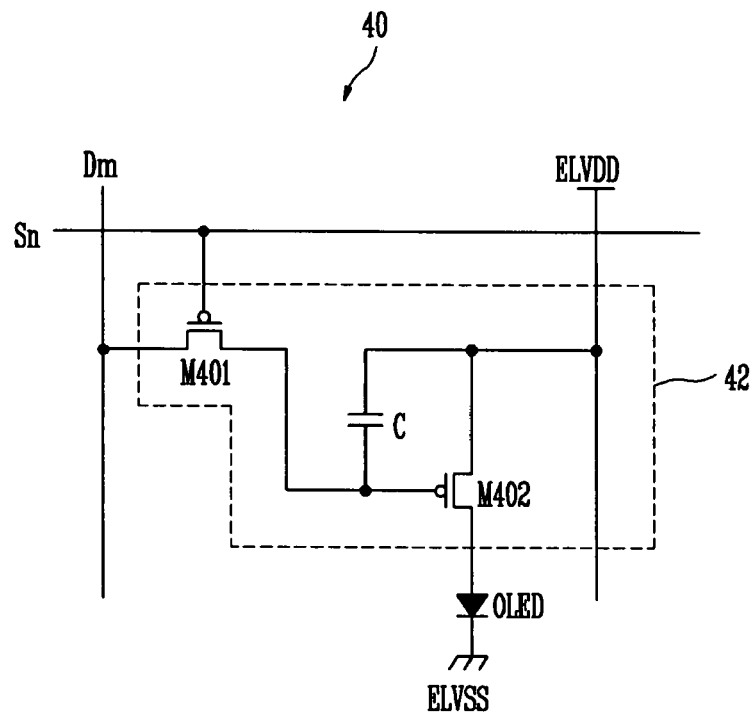
FIG. 3 illustrates an embodiment of a pixel in a pixel region of the OLED display shown in FIG. 1.

FIG. 3 illustrates an embodiment of the pixel 40 in the pixel region 30 of the OLED display shown in FIG. 1. For convenience of the description, FIG. 3 shows a pixel 40, which is connected to an $n^{th}$ scan line Sn and an $m^{th}$ data line Dm.

Referring to FIG. 3, the pixel 40 of the present invention may include an organic light emitting diode (OLED) and a pixel circuit 42. The pixel circuit 42 may be connected to the data line Dm and the scan line Sn, and may control emission or non-emission of light by the pixel 40.

The pixel circuit 42 may be connected to a first power supply ELVDD. An anode electrode of the OLED may be connected to the pixel circuit 42, and a cathode electrode of the OLED may be connected to a second power supply ELVSS. The OLED may emit light (or not) in sub frames SF1 to SF8 corresponding to an electric current provided by the pixel circuit 42.

The pixel circuit 42 may include a first transistor M401, a second transistor M402, and a storage capacitor C. The first transistor M401 may be configured to connect the gate electrode of the second transistor M402 to the data line Dm, and may have a gate electrode connected to the scan line Sn. A first electrode of the first transistor M401 may be connected to a data line Dm, and a second electrode of the first transistor M401 may be connected to an electrode of the storage capacitor C. The first electrode may be one of a source electrode and a drain electrode, and the second electrode may be the other of the source electrode and the drain electrode. For example, when the first electrode is the source electrode, the second electrode may be the drain electrode. The second transistor M402 may be configured to connect the first power supply ELVDD to the OLED. A gate electrode of the second transistor M402 may be connected to an electrode of the storage capacitor C, and a first electrode of the second transistor may be connected to another electrode of the storage capacitor C and the first power supply ELVDD. A second electrode of the second transistor M402 may be connected to the OLED. The storage capacitor C may be connected between the gate electrode of the second transistor M402 and a first electrode of the second transistor M402.

When the scan signal is provided to the scan line Sn, the pixel circuit 42 may control emission or non-emission of the OLED according to a data signal provided to the data line Dm. During each scan period of sub frames SF1 to SF8, when the scan signal is provided to a scan line Sn, the first transistor M401 may be turned-on to provide the data signal of the data line Dm to the storage capacitor C. The second transistor M402 may control emission or non-emission of light according to a voltage stored in the storage capacitor C. For example, when the storage capacitor C is charged with a voltage corresponding to the first data signal, the second transistor M402 may provide a predetermined current that causes the OLED to emit light. When the storage capacitor C is charged with a voltage corresponding to the second data signal, the second transistor M402 may not provide current to the OLED, and thus the OLED may not emit light.

Figure 4:
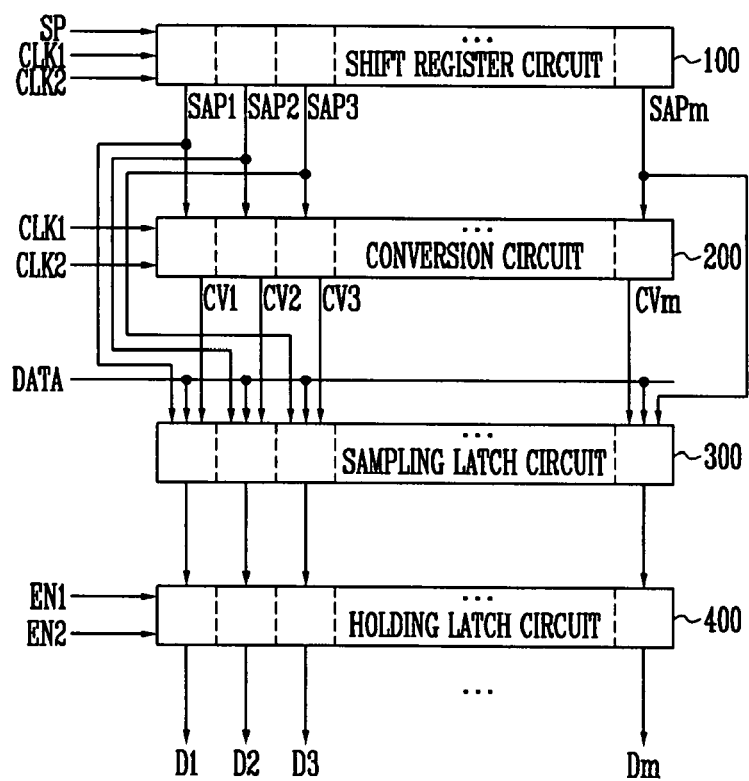
FIG. 4 illustrates an embodiment of the data driver shown in FIG. 1.

FIG. 4 illustrates an embodiment of the data driver shown in FIG. 1. Referring to FIG. 4, the data driver 20 according to an embodiment of the present invention may include a shift register circuit 100, a conversion circuit 200, a sampling latch circuit 300, and a holding latch circuit 400.

The shift register circuit 100 may receive a start signal SP, a first clock signal CLK1, and a second clock signal CLK2, and may sequentially provide sampling signals SAP1 to SAPm (hereinafter collectively referred to as sampling signals SAP). The shift register circuit 100 may include m shift registers.

The conversion circuit 200 may receive the first clock signal CLK1, the second clock signal CLK2, and the sampling signals SAP, and may sequentially provide conversion signals CV1 to CVm (hereinafter collectively referred to as conversion signals CV). The conversion circuit 200 may include m conversion circuits.

The sampling latch circuit 300 may receive the sampling signals SAP and the conversion signals CV. When the sampling latch circuit 300 receives the sampling signals SAP and the conversion signals CV, it may receive and temporarily store data DATA. The sampling latch circuit 300 may include m sampling latches. Each of the sampling latches may store 1 bit of data.

The holding latch circuit 400 may receive a first enable signal EN1 and a second enable signal EN2. When the holding latch circuit 400 receives the first enable signal EN1 and the second enable signal EN2, it may simultaneously receive all of the data stored in the sampling latch circuit 300, and may provide the data DATA to the data lines D1 to Dm as data signals. The holding latch circuit 400 may include m holding latches.

Figure 5:
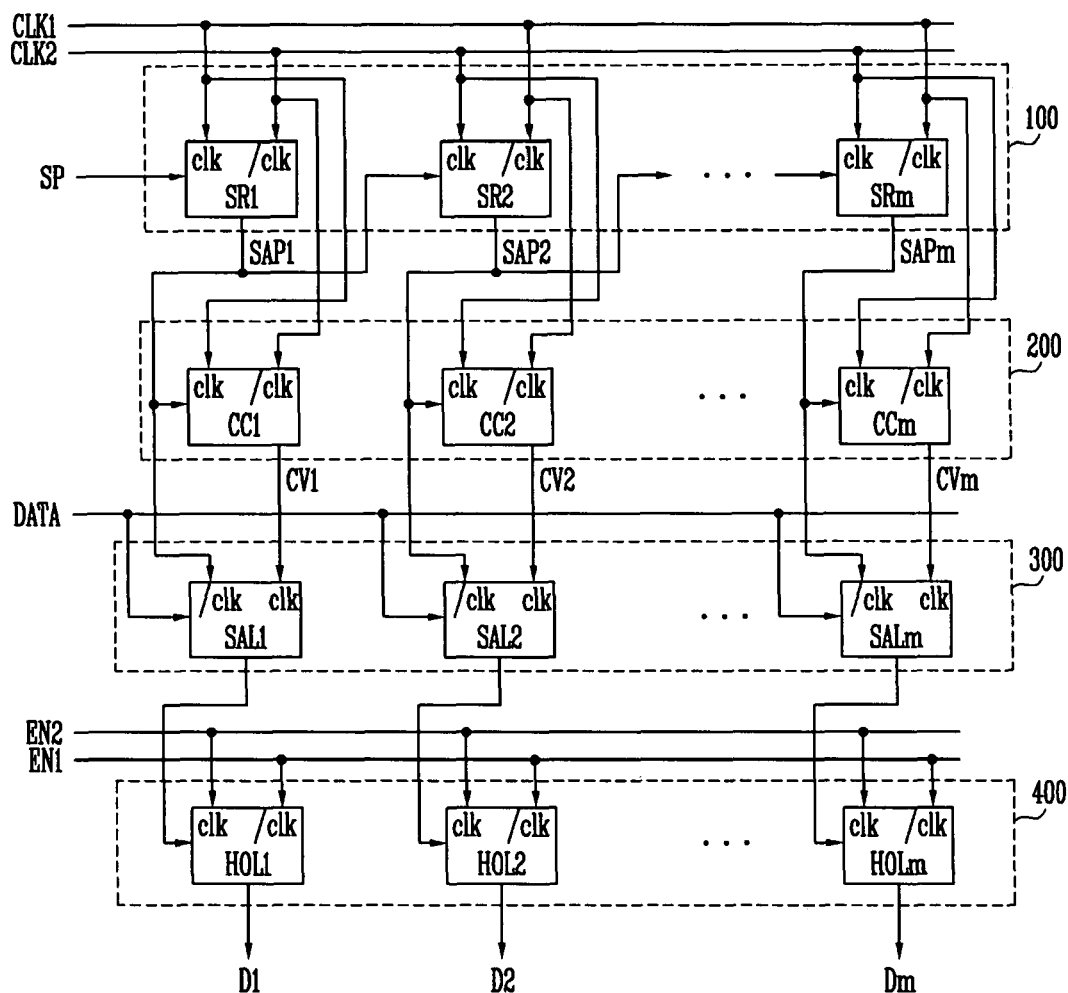
FIG. 5 illustrates details of a shift register circuit, a conversion circuit, a sampling latch circuit, and a holding latch circuit shown in FIG. 4.

FIG. 5 illustrates details of a shift register circuit, a conversion circuit, a sampling latch circuit, and a holding latch circuit shown in FIG. 4. Referring to FIG. 5, the shift register circuit 100 may include m shift registers SR1 to SRm, the conversion circuit 200 may include m conversion circuits CC1 to CCm, the sampling latch circuit 300 may include m sampling latches SAL1 to SALm, and the holding latch circuit 400 may include m holding latches HOL1 to HOLm.

Figure 6:
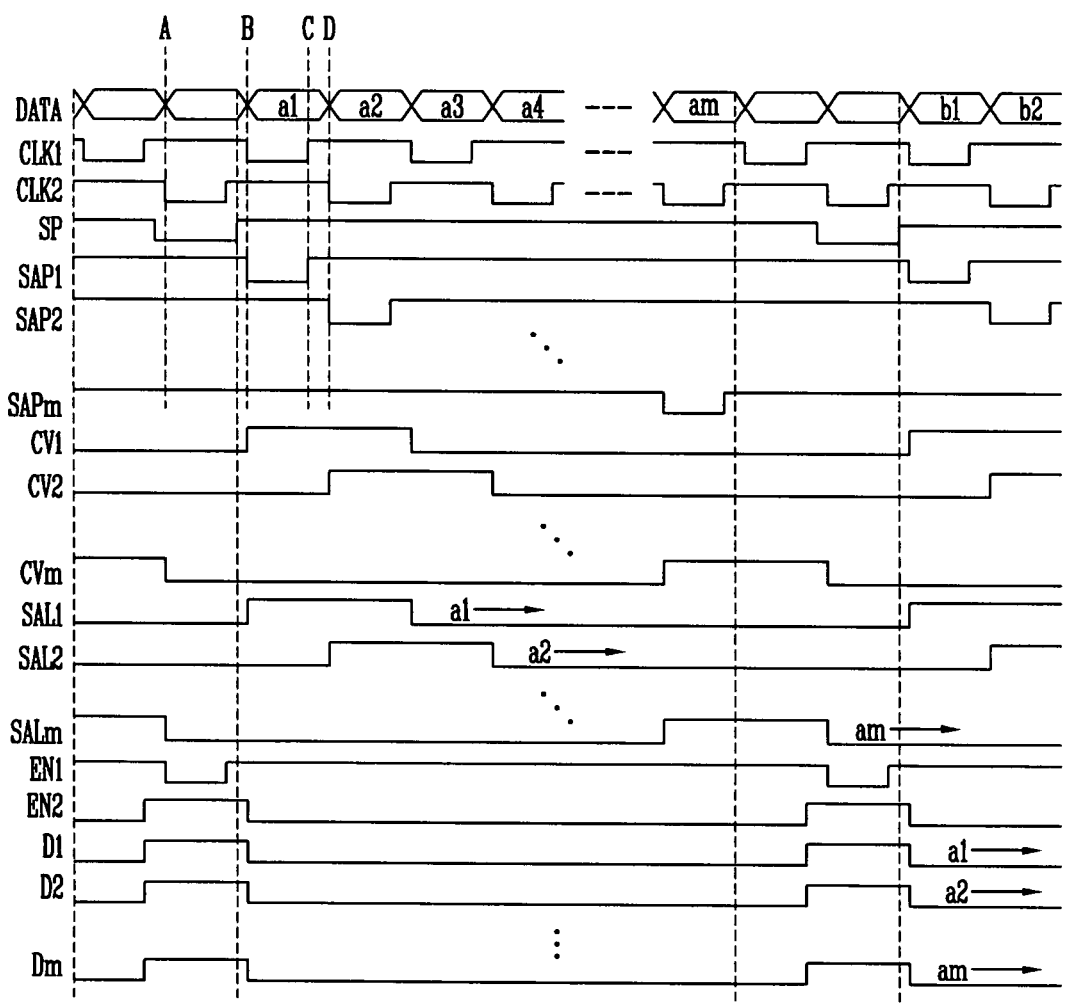
FIG. 6 illustrates a timing diagram of a driving method of the data driver shown in FIG. 5.

Among the shift registers SR1 to SRm, odd-numbered shift registers, i.e., SR1, SR3, etc., may receive the first clock signal CLK1 through a first input terminal (clk) and may receive the second clock signal CLK2 through a second input terminal (/clk). Even-numbered shift registers, i.e., SR2, SR4, etc., may receive the second clock signal CLK2 through a first input terminal (clk) and may receive the first clock signal CLK1 through a second input terminal (/clk). As shown in FIG. 6, the first clock signal CLK1 and the second clock signal CLK2 may have a same waveform with a phase difference of about 180° (180 degrees).

Referring again to FIG. 5, the first shift register SR1 may receive the first clock signal CLK1, the second clock signal CLK2, and the start signal SP, and may provide the first sampling signal SAP1. The second shift register SR2 may receive the first clock signal CLK1, the second clock signal CLK2, and the first sampling signal SAP1, and may provide the second sampling signal SAP2. Thus, as shown in FIG. 6, the shift registers SR1 to SRm may receive the start signal SP (SR1) or the sampling signal SAP of a previous stage (SR2 to SRm), and may sequentially provide sampling signals SAP1 to SAPm.

Among the conversion circuits CC1 to CCm, odd-numbered conversion circuits, i.e., CC1, CC3, etc., may receive the first clock signal CLK1 through a first input terminal (clk) and may receive the second clock signal CLK2 through a second input terminal (/clk). Even-numbered conversion circuits, i.e., CC2, CC4, etc., may receive the second clock signal CLK2 through the first input terminal (clk) and may receive the first clock signal CLK1 through the second input terminal (/clk).

The conversion circuits CC1 to CCm may receive the first clock signal CLK1, the second clock signal CLK2, and the respective sampling signals SAP1 to SAPm, and may provide respective conversion signals CV1 to CVm. Thus, the first conversion circuit CC1 may receive the first clock signal CLK1, the second clock signal CLK2, and the first sampling signal SAP1, and may provide the first conversion signal CV1. The second conversion circuit CC2 may receive the first clock signal CLK1, the second clock signal CLK2, and the second sampling signal SAP2, and may provide the second conversion signal CV2. As shown in FIG. 6, the second conversion signal CV2 may overlap with the first conversion signal CV1 for a predetermined time period.

The sampling latches SAL1 to SALm may respectively receive the conversion signals CV1 to CVm through a first input terminal (clk), and may receive the respective sampling signals SAP1 to SAPm through a second input terminal (/clk). When the sampling latches SAL1 to SALm receive the respective conversion signals CV1 to CVm and the respective sampling signals SAP1 to SAPm, the sampling latches SAL1 to SALm may store and maintain data DATA during a predetermined time period. Thus, the first sampling signal SAP1 and the first conversion signal CV1 may be provided to the first sampling latch SAL1, which may receive and maintain the data DATA during the predetermined time period. The second sampling signal SAP2 and the second conversion signal CV2 may be provided to the second sampling latch SAL2, which may receive and maintain the data DATA during the predetermined time period. One (1) bit data DATA, e.g., data having a high or low state, may be stored in each of the sampling latches SAL1 to SALm.

The holding latches HOL1 to HOLm may receive the second enable signal EN2 through a first input terminal (clk) and may receive the first enable signal EN1 through a second input terminal (/clk). When the holding latches HOL1 to HOLm receive the first enable signal EN1 and the second enable signal EN2, they may simultaneously receive the respective data DATA that is stored in the sampling latches SAL1 to SALm. Thus, the first holding latch HOL1 may receive a first data DATA from the first sampling latch SAL1, the second holding latch HOL2 may simultaneously receive a second data DATA from the second sampling latch SAL2, etc. The holding latches HOL1 to HOLm may provide one of the first data signal and the second data signal to the respective data lines D1 to Dm, according to a polarity of the stored data DATA.

Figure 7:
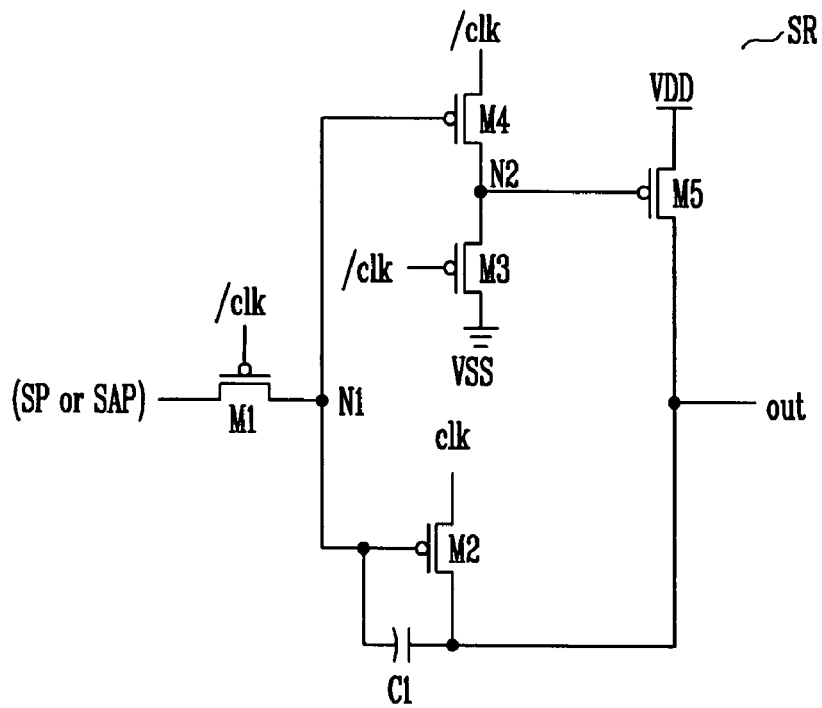
FIG. 7 illustrates a first embodiment of the shift register shown in FIG. 5.

FIG. 7 illustrates a first embodiment of a shift register SR shown in FIG. 5, which may be applied to each of the m shift registers SR1 to SRm. Referring to FIG. 7, the shift register SR according to an embodiment of the present invention may include a first transistor M1, a second transistor M2, a third transistor M3, a fourth transistor M4, a fifth transistor M5, and a capacitor C1. The first through fifth transistors M1 to M5 may be PMOS transistors. The shift register SR may be connected to third and fourth power supplies VDD and VSS, respectively. A voltage of the third power supply VDD may be greater than that of the fourth power supply VSS.

A first electrode of the first transistor M1 may be connected to an external input terminal (in) for receiving the start signal SP (SR1) or the sampling signal SAP of a shift register SR of a previous stage (SR2 to SRm). A gate electrode of the first transistor M1 may be connected to the second input terminal (/clk), and a second electrode of the first transistor M1 may be connected to a first node N1.

A gate electrode of the second transistor M2 may be connected to the first node N1, a first electrode thereof may be connected to the first input terminal (clk), and a second electrode thereof may be connected to an output terminal (out).

Electrodes of the fourth transistor M4 and the third transistor M3 may be serially connected between the second input terminal (/clk) and the fourth power supply VSS. In detail, a first electrode of the fourth transistor M4 may be connected to the second input terminal (/clk), and a second electrode thereof may be connected to a second node N2. A gate electrode of the fourth transistor M4 may be connected to the first node N1. A first electrode of the third transistor M3 may be connected to the second node N2, and a second electrode of the third transistor M3 may be connected to the fourth power supply VSS. A gate electrode of the third transistor M3 may be connected to the second input terminal (/clk).

A first electrode of the fifth transistor M5 may be connected to the third power supply VDD, and a second electrode of the fifth transistor M5 may be connected to the output terminal (out). A gate electrode of the fifth transistor M5 may be connected to the second node N2.

The capacitor C1 may be connected between the gate electrode of the second transistor M2 and a second electrode of the second transistor M2.

The first transistor M1 may be turned-on or turned-off according to the second clock signal CLK2 provided to the second input terminal (/clk). When the first transistor M1 is turned-on, the capacitor C1 may be charged with a voltage that corresponds to the start signal SP or the sampling signal SAP of a previous stage applied to the first node N1. The second transistor M2 may be turned-on or turned-off according to a voltage applied to the first node N1. The third transistor M3 may be turned-on or turned-off according to the second clock signal CLK2 provided to the second input terminal (/clk). The fourth transistor M4 may be turned-on or turned-off according to the voltage applied to the first node N1. The fifth transistor M5 may be turned-on or turned-off according to a voltage applied to the second node N2.

An exemplary operation of the shift register SR will now be described using, as an example, the first shift register SR1. In the following description, it will be assumed that high level voltages of the shift register SR1 are set as a voltage of the third power supply VDD, and low level voltages of the first and second clock signals CLK1 and CLK2 are set as a voltage of the fourth power supply VSS. VSS may be set at a ground voltage GND.

In operation of the shift register SR1, the first clock signal CLK1 at a high level, the second clock signal CLK2 at a low level, and the start signal SP at a low level may be input to the shift register SR1, as indicated by point A in FIG. 6. The first transistor M1 and the third transistor M3 receiving the second clock CLK2 at the low level may be turned-on. When the first transistor M1 is turned-on, the start signal SP at a low level may be provided to the first node N1, and the second transistor M2 and the fourth transistor M4 may be turned-on. When the second transistor M2 is turned-on, the first clock signal CLK1 at a high level may be provided to the output terminal (out). When the fourth transistor M4 is turned-on, the second clock signal CLK2 at a low level may be provided to the second node N2. Also, when the third transistor M3 is turned-on, a low level voltage of the fourth power supply VSS may be provided to the second node N2. In this case, the fifth transistor M5 may be turned-on, and may connect a high level voltage of the third power supply VDD to the output terminal (out).

The capacitor C1 may be charged with a voltage corresponding to a difference between the first node N1 and the output terminal (out). Thus, the capacitor C1 may be charged with a voltage corresponding to a difference between a low voltage of the start signal SP and a high level voltage of the third power supply VDD.

The second clock signal CLK2 may then change to a high level. When the second clock signal CLK2 is at a high level, the first transistor M1 and the third transistor M3 receiving the second clock signal CLK2 at a high level may be turned-off. At this time, the first node N1 may be maintained at a level corresponding to the voltage charged in the capacitor C1. The voltage charged in the capacitor C1 may keep the second transistor M2 and the fourth transistor M4 turned-on. When the fourth transistor M4 is turned-on, the second clock signal at a high level may be provided via from the first electrode of the fourth transistor M4 to the second node N2, thereby causing the fifth transistor M5 to be turned-off. Thus, the voltage level output at the output terminal (out) may be determined only by the first clock signal CLK1.

The first clock signal CLK1 may then change to a low level. When the first clock signal CLK1 is at a low level, the voltage at the output terminal (out), which is provided by the second transistor M2, may be changed to the low level voltage of the first clock signal CLK1. Thus, the first sampling signal SAP1 at a low level may be provided by the shift register SR1 at the output terminal (out), as indicated by point B in FIG. 6.

The first clock signal CLK1 may then change back to a high level while the second clock signal CLK2 remains at a high level. When the first clock signal CLK1 is at the high level, the voltage at the output terminal (out), which is provided by the second transistor M2, may again follow the voltage of the first clock signal CLK1 and, thus, may be changed to the high level voltage of the first clock signal CLK1. Accordingly, the first sampling signal SAP1 at a high level may be provided by the shift register SR1 at the output terminal (out), as indicated by point C in FIG. 6.

The second clock signal CLK2 may then change back to a low level while no start signal SP is provided. When the first clock signal CLK1 is at a high level and the second clock signal CLK2 is at a low level with no start signal to SP, the first transistor M1 and the third transistor M3 receiving the second clock signal CLK2 at a low level may be turned-on. When the third transistor M3 is turned-on, a voltage of the fourth power supply VSS may be provided to the second node N2, which may turn on the fifth transistor M5 and cause a high voltage of the third power supply VDD to be provided to the output terminal (out). Also, when the first transistor M1 is turned-on, a high level voltage may be provided to the first node N1, so that the capacitor C1 is not charged with a voltage. When the capacitor C1 is not charged with a voltage, during this phase of clock signals, following point D in FIG. 6, when CLK1 and CLK2 are inverted to match their respective states at point A, the shift register SR1 may maintain the output signal SAP1 at a high level.

As described above, when the start pulse SP at a low level voltage is input to the shift register SR, i.e., to the first electrode of the first transistor M1, it may be stored as a low level voltage in the capacitor C1 during a half period of the first and second clock signals CLK1 and CLK2, and may output a low level voltage, that is, a sampling signal SAP1, during a remaining half period thereof.

Subsequently, when the first clock signal CLK1 is at a low level, the second clock signal CLK2 is at a high level, and the first sampling signal SAP1 is input to a second shift register SR2, a capacitor C1 of the second shift registers SR2 may be charged with a voltage corresponding to the first sampling signal SAP1. Further, when the first clock signal CLK1 is inverted into a high level and the second clock signal CLK2 is inverted to a low level, the second shift register SR2 may output a second sampling signal SAP2. Thus, the shift registers SR1 to SRm of the present invention may repeat the aforementioned processes to sequentially output sampling signals SAP1 to SAPm.

Figure 8:
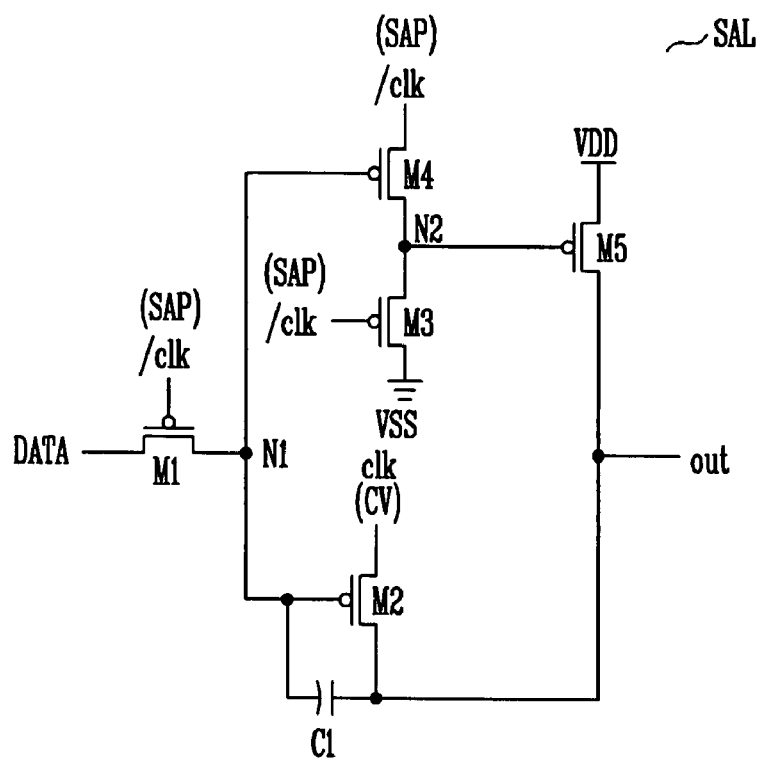
FIG. 8 illustrates a first embodiment of the sampling latch shown in FIG. 5.

FIG. 8 illustrates a first embodiment of the sampling latch SAL shown in FIG. 5. Referring to FIG. 8, each of the sampling latches SAL1 to SALm shown in FIG. 8 may be constructed by the same circuit as that of the shift register SR shown in FIG. 7. The sampling latches SAL1 to SALm may receive a respective conversion signal CV through the first input terminal (clk) and may receive a respective sampling signal SAP through the second input terminal (/clk).

The operation of the sampling latches SAL1 to SALm will be described with reference to the waveform diagram of FIG. 6. First, when the first sampling signal SAP1 is at a low level and the conversion signal CV1 is at a high level, a first sampling latch SAL1 may receive a high or low level data DATA. Here, the data DATA input to the first sampling latch SAL1 may be stored in the capacitor C1. Because the first sampling signal SAP1 is at a low level, the fifth transistor M5 may be turned-on, so that a high level voltage may be output to the output terminal (out).

Next, when the supply of the first sampling signal SAP1 stops, i.e., SAP1 transitions to a high level voltage, and the supply of the conversion signal CV1 stops, i.e., transitions to a low level voltage, a voltage corresponding to data DATA may be output to the output terminal (out). For example, when a data signal DATA at a low level voltage is input to the first sampling latch SAL1, a low level voltage may be output to the output terminal (out). When a data signal DATA at a high level voltage is input to the first sampling latch SAL1, a high level voltage may be output. The sampling latches SAL1 to SALm of the present invention may receive data DATA corresponding to the sampling signal SAP and the conversion signal CV, and output a voltage, corresponding to the received data DATA, to the output terminal (out).

Figure 9:
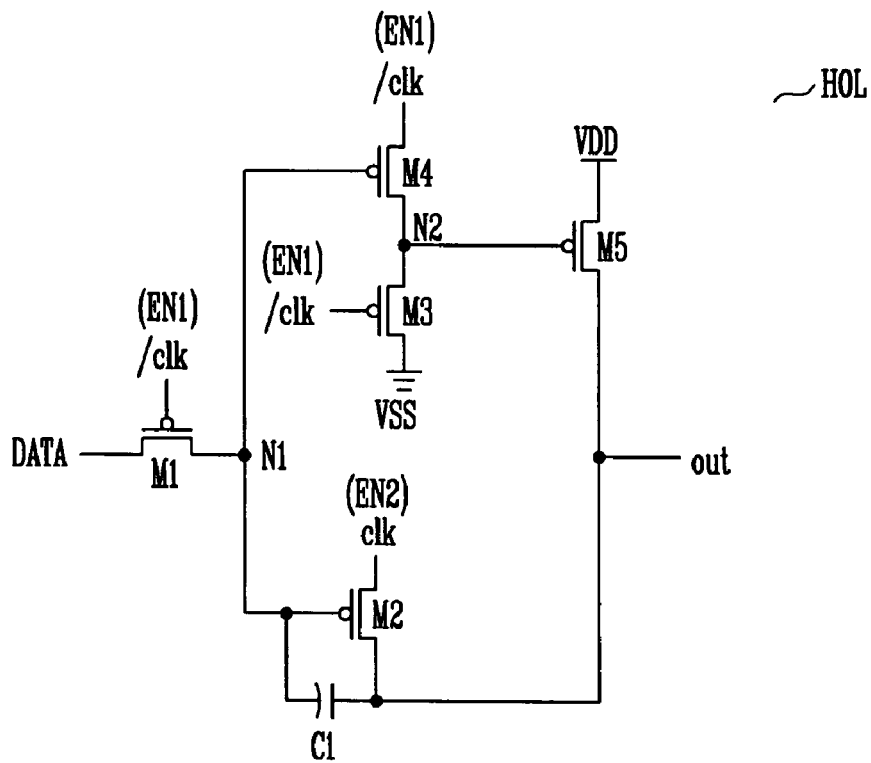
FIG. 9 illustrates a first embodiment of the holding latch shown in FIG. 5.

FIG. 9 illustrates a first embodiment of the holding latch shown in FIG. 5. Referring to FIG. 9, each of the holding latches HOL1 to HOLm shown in FIG. 9 may be constructed by the same circuit as that of the shift register SR shown in FIG. 7. The holding latches HOL1 to HOLm may receive the second enable signal EN2 through the first input terminal (clk) and may receive the first enable signal EN1 through the second input terminal (/clk).

The operation of the holding latches HOL1 to HOLm will be described with reference to the waveform diagram of FIG. 6. First, after the data signals DATA are input to the sampling latches SAL1 to SALm, the first enable signal EN1 is at a low level and the second enable signal EN2 is at a high level. Accordingly, each of the holding latches HOL1 to HOLm may receive a data signal DATA from respective ones of the sampling latches SAL1 to SALm. The data signals DATA input to the holding latches HOL1 to HOLm may be stored in a capacitor C1 of the respective holding latches HOL1 to HOLm.

Thereafter, the first enable signal EN1 is at a high level, and the second enable signal EN2 is at a low level. The holding latches HOL1 to HOLm may supply the first data signal or the second data signal to the data lines D1 to Dm, where the first data signal and the second data signal respectively corresponding to data signal DATA stored in the holding latch HOL.

Figure 10:
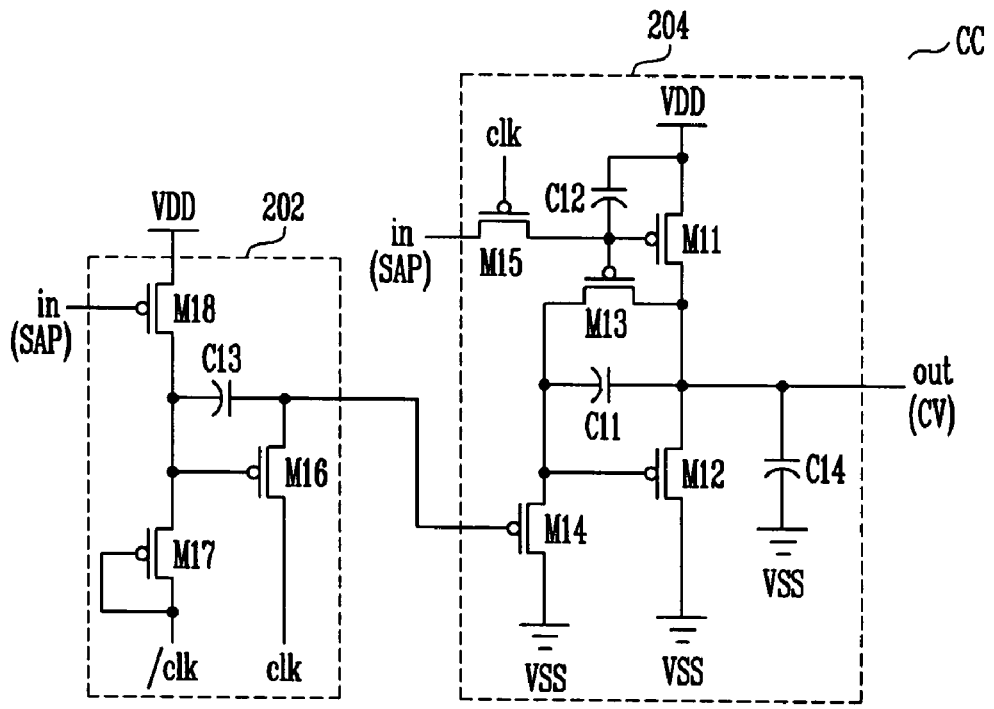
FIG. 10 illustrates a first embodiment of the conversion circuit shown in FIG. 5.

FIG. 10 illustrates a first embodiment of the conversion circuit CC shown in FIG. 5. Referring to FIG. 10, each of conversion circuits CC1 to CCm according to an embodiment of the present invention may include an input circuit 202 and an output circuit 204. Transistors M11 to M18 included in the input circuit 202 and the output circuit 204 may be PMOS transistors.

The input circuit 202 may provide a low or high level voltage to the output circuit 204 according to a voltage provided to a first input terminal (clk), a second input terminal (/clk), and a third input terminal (in). The output circuit 204 may control an output or a non-output of a conversion signal CV according to a high or low level voltage from the input circuit 202, a state of the clock signal CLK1 or CLK2 input to a first input terminal (clk), and a sampling signal SAP input to a third input terminal (in).

The input circuit 202 may include the sixteenth through eighteenth transistors M16 to M18. The sixteenth transistor M16 may be connected between the eighteenth transistor M18 and the output circuit 204. A first electrode of the sixteenth transistor M16 may be connected to an input of the output circuit 204, and a second electrode of the sixteenth transistor M16 may be connected to the first input terminal (clk). A gate electrode of the sixteenth transistor M16 may be connected to a second electrode of an eighteenth transistor M18 and a first electrode of a seventeenth transistor M17.

The seventeenth transistor M17 may be connected between the eighteenth transistor M18 and a second input terminal (/clk). A gate electrode and a second electrode of the seventeenth transistor M17 may be connected to the second input terminal (/clk), and the first electrode of the seventeenth transistor M17 may be connected to the second electrode of the eighteenth transistor M118. The seventeenth transistor M17 may be diode-connected and may be turned-on or turned-off according to a first clock signal CLK1 or a second clock signal CLK2 provided to the second input terminal (/clk).

The eighteenth transistor M18 may be connected between the third power supply VDD and the third input terminal (in). A gate electrode of the eighteenth transistor M18 may be connected to the third input terminal (in), and the first electrode of the eighteenth transistor M18 may be connected to the third power supply VDD. The second electrode of the eighteenth transistor M18 may be connected to the gate electrode of the sixteenth transistor M116.

The thirteenth capacitor C13 may be connected between the first electrode and the gate electrode of the sixteenth transistor M116.

In operation of the input circuit 202, the sixteenth transistor M16 may be turned-on or turned-off according to a voltage at the second input terminal (/clk), a voltage at the third input terminal (in), or a voltage stored in the thirteenth capacitor C13. The eighteenth transistor M18 may be turned-on or turned-off according to a voltage provided to the third input terminal (in). The thirteenth capacitor C13 may be charged with a voltage corresponding to turning-on or turning-off of the sixteenth transistor M16. For example, when the sixteenth transistor M16 is turned-on, the thirteenth capacitor C13 may be charged with a voltage capable of turning-on the sixteenth transistor M16. When the sixteenth transistor M16 is turned-off, the thirteenth capacitor C13 may be charged with a voltage capable of turning-off the sixteenth transistor M16.

The output circuit 204 may include eleventh through fifteenth transistors M11 to M15, an eleventh capacitor C11, and a twelfth capacitor C12. A gate electrode of the eleventh transistor M11 may be connected to a second electrode of the fifteenth transistor M115, first electrode of the eleventh transistor M11 may be connected to the third power supply VDD, and a second electrode of the eleventh transistor M11 may be connected to an electrode of the twelfth transistor M12 and the output terminal (out).

A gate electrode of the twelfth transistor M12 may be connected to a first electrode of the fourteenth transistor M14, an electrode of the eleventh capacitor C11, and a second electrode of the thirteenth transistor M13. A first electrode of the twelfth transistor M12 may be connected to the output terminal (out), and a second electrode of the twelfth transistor M12 may be connected to the fourth power supply VSS. The twelfth transistor M12 and the fourteenth capacitor C14 may be connected between the output terminal (out) and a fourth power supply VSS.

Electrodes of the thirteenth transistor M13 and the eleventh capacitor C11 may be connected in parallel between the gate electrode and the first electrode of the twelfth transistor M12. A second electrode of the thirteenth transistor M13 may be connected to a gate electrode of the twelfth transistor M12. A gate electrode of the thirteenth transistor M13 may be connected to a gate electrode of the eleventh transistor M11, and a first electrode of the thirteenth transistor M13 may be connected to a second electrode of the eleventh transistor M11.

Electrodes of the fourteenth transistor M14 may be connected between the gate electrode of the twelfth transistor M12 and an output of the input circuit 202. A gate electrode of the fourteenth transistor M14 may be connected to an output of the input circuit 202, and the first electrode of the fourteenth electrode may be connected to the gate electrode of the twelfth transistor M112. A second electrode of the fourteenth transistor M14 may be connected to the fourth power supply VSS.

Electrodes of the fifteenth transistor M15 may be connected between the third input terminal (in) and the gate electrode of the eleventh transistor M11. A gate electrode of the fifteenth transistor M15 may be connected to the first input terminal (clk) and a first electrode of the fifteenth transistor M15 may be connected to the third input terminal (in). A second electrode of the fifteenth transistor M15 may be connected to the gate electrode of the eleventh transistor M11.

The eleventh capacitor C11 may be connected between a first electrode and a gate electrode of the twelfth transistor M12. The twelfth capacitor C12 may be connected between the gate electrode and the first electrode of the eleventh transistor M11. The fourteenth capacitor C14 may be connected between the output terminal (out) and the fourth power supply VSS.

In operation of the output circuit 204, when the fifteenth transistor M15 is turned-on, the eleventh transistor M11 may be turned-on or turned-off according to a voltage input from the third input terminal (in) or a voltage charged in the twelfth capacitor C12. The twelfth capacitor C12 may be charged with a voltage according to turning-on or turning-off of the eleventh transistor M11. For example, when the eleventh transistor M11 is turned-on, the twelfth capacitor C12 may be charged with a voltage capable of turning on the eleventh transistor M11. When the eleventh transistor M11 is turned-off, the twelfth capacitor C12 may be charged with a voltage capable of turning off the eleventh transistor M11. The eleventh capacitor C11 may be charged with a voltage according to turning-on or turning-off of the twelfth transistor M12, i.e., when the twelfth transistor M12 is turned-on, the eleventh capacitor C11 may be charged with a voltage capable of turning-on the twelfth transistor M12, and when the twelfth transistor M12 is turned-off, the eleventh capacitor C11 may be charged with a voltage capable of turning-off the twelfth transistor M12. The thirteenth transistor M13 may be turned-on or turned-off simultaneously with the eleventh transistor M11 and may control a voltage provided to a gate electrode of the twelfth transistor M12. The fourteenth transistor M14 may be turned-on or turned-off according to a voltage from an output from the input circuit 202 and may to control a voltage provided to the gate electrode of the twelfth transistor M12. The fourteenth capacitor C14 may be used to stabilize a voltage of the output terminal (out). The fifteenth transistor M15 may be turned-on or turned-off according to the first clock signal CLK1 or the second clock signal CLK2 input to the first input terminal (clk) and may control a voltage provided from the third input terminal (in) to the gate electrode of the eleventh transistor M11.

Figure 11:
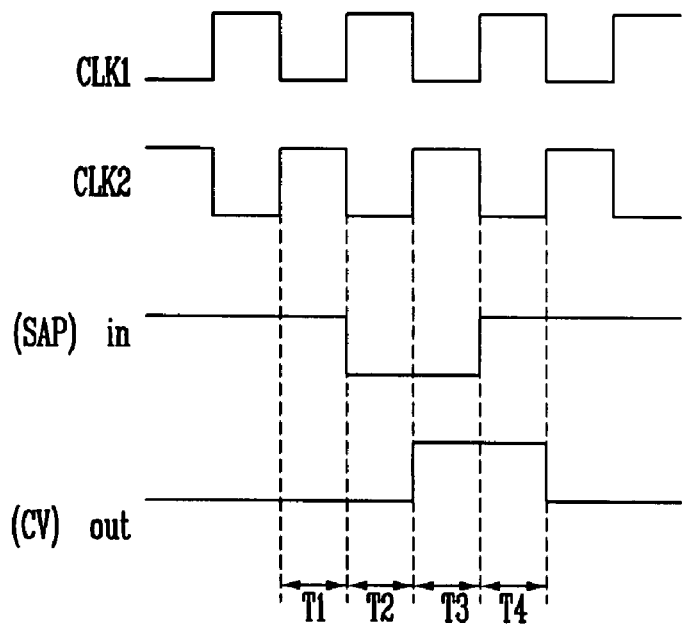
FIG. 11 illustrates a waveform diagram of a driving method of the conversion circuit shown in FIG. 10.

The operation of the conversion circuit will now be explained with reference to FIGS. 10 and 11. FIG. 11 illustrates a waveform diagram of a driving method of the conversion circuit shown in FIG. 10. In the following description, it is assumed that the first clock signal CLK1 is provided to the first input terminal (clk), and the second clock signal CLK2 is provided to the second input terminal (/clk) in FIG. 10.

During a first time period T1, a low level voltage, a high level voltage, and a high level voltage may be input to the first input terminal (clk), the second input terminal (/clk), and the third input terminal (in), respectively. When the high level voltage is provided to the third input terminal (in) and the second input terminal (/clk), the seventeenth transistor M17 and the eighteenth transistor M18 may be turned-off. At this time, the sixteenth transistor M16 may be turned-on according to a voltage stored in the thirteenth transistor M13. Accordingly, the low level voltage input to the first input terminal (clk) may be output to by the input circuit 202.

When the low level voltage is output by the input circuit 202, the fourteenth transistor M14 may be turned-on. Also, the fifteenth transistor M15 may be turned-on according to a low level voltage provided to the first input terminal (clk). When the fifteenth transistor M15 is turned-on, the high level voltage provided to the third input terminal (in) may be provided to the eleventh transistor M11 and the thirteenth transistor M13, such that the eleventh transistor M11 and the thirteenth transistor M13 may be turned-off, and the twelfth capacitor C12 may be charged with a voltage corresponding to turning-off thereof.

Moreover, when the fourteenth transistor M14 is turned-on, a voltage of the fourth power supply VSS may be provided to the gate electrode of the twelfth transistor M12 and, when the voltage of the fourth power supply VSS is provided to the gate electrode of the twelfth transistor M12, the twelfth transistor M12 may be turned-on, thereby causing the eleventh capacitor C11 to be charged with a voltage corresponding to turning-on thereof. Also, when the twelfth transistor M12 is turned-on, a low level voltage may be output to an output terminal (out) during the first time period T1.

During a second time period T2, a high level voltage, a low level voltage, and a low level voltage may be input to the first input terminal (clk), the second input terminal (/clk), and the third input terminal (in), respectively. When the low level voltage is input to the second input terminal (/clk), the seventeenth transistor M17 of the input circuit 202 may be turned-on. Further, when the low level voltage is input to the third input terminal (in), the eighteenth transistor M18 may be turned-on. In this case, the sixteenth transistor M16 may be turned-on, such that the input circuit 202 outputs the high level voltage that is input to the first input terminal (clk). At this time, the thirteenth capacitor C13 may be charged with a voltage corresponding to a turning-on state of the sixteenth transistor M16.

When the high level voltage is output by the input circuit 202, the fourteenth transistor M14 may be turned-off. Moreover, the fifteenth transistor M15 may be turned-off according to the high level voltage provided to the first input terminal (clk). When the fifteenth transistor M15 is turned-off, the eleventh transistor M1 and the thirteenth transistor M13 may be turned-off according to a turning-off voltage stored in the twelfth capacitor C12. In addition, when the fourteenth transistor M14 is turned-off, the twelfth transistor M12 may be turned-on according to a turning-on voltage stored in the eleventh transistor M11. Accordingly, the low level voltage may be output by the output circuit 204 to the output terminal (out). That is, a voltage of a previous stage, i.e., first time period T1, may be maintained during the second time period T2.

During a third time period T3, a low level voltage, a high level voltage, and a low level voltage may be input to the first input terminal (clk), the second input terminal (/clk), and the third input terminal (in), respectively. When the high level voltage is input to the second input terminal (/clk), the seventeenth transistor M17 of the input circuit 202 may be turned-off. Further, when the low level voltage is input to the third input terminal (in), the eighteenth transistor M18 may be turned-on. Accordingly, a gate voltage of the sixteenth transistor M16 may be increased to a voltage of a third power supply VDD. When the gate voltage of the sixteenth transistor M16 is increased to a voltage of a third power supply VDD, a voltage at the first electrode of the sixteenth transistor M16 may not be reduced to less than the voltage of the third power supply VSS, so that the fourteenth transistor M14 of the output circuit 204 may be turned-off.

The fifteenth transistor M15 may be turned-on according to the low level voltage provided to the first input terminal (clk). When the fifteenth transistor M15 is turned-on, the low level voltage input to the third input terminal (in) may be provided to gate electrodes of the eleventh transistor M11 and the thirteenth transistor M13, which may be turned-on. In this case, the twelfth capacitor C12 may be charged with a turning-on voltage of the eleventh transistor M11.

When the eleventh transistor M11 is turned-on, a voltage of the third power supply VDD may be provided to the output terminal (out), i.e., a high level voltage may be output to the output terminal (out). When the thirteenth transistor M13 is turned-on, the voltage of the third power supply VDD may be provided to the gate electrode of the twelfth transistor M12 to turn off the twelfth transistor M12. In this case, a voltage corresponding to a turning-off of the twelfth transistor M12 may be stored in the eleventh transistor M11.

During a fourth time period T3, a high level voltage, a low level voltage, and a high level voltage may be input to the first input terminal (clk), the second input terminal (/clk), and the third input terminal (in), respectively. When the low level voltage is input to the second input terminal (/clk), the seventeenth transistor M17 of the input circuit 202 may be turned-on. Further, when the high level voltage is input to the third input terminal (in), the eighteenth transistor M18 may be turned-off. Accordingly, the low level voltage input to the second input terminal (/clk) may be transferred to the sixteenth transistor M16 to turn-on the sixteenth transistor M16. When the sixteenth transistor M16 is turned-on, the high level voltage input to the first input terminal (clk) may be output by the input circuit 202 to the fourteenth transistor M14 of the output circuit 204 to turn-off the fourteenth transistor M14.

The fifteenth transistor M15 may be turned-off according to the high level voltage provided to the first input terminal (clk). When the fifteenth transistor M15 is turned-off, the eleventh transistor M11 and the thirteenth transistor M13 may be turned-on by a voltage stored in the twelfth capacitor C12. Further, when the fourteenth transistor M14 is turned-off, the twelfth transistor M12 may be turned-off according to a voltage stored in the eleventh capacitor C11. Thus, during the fourth time period T4, the conversion circuit may output the same high level voltage as output during the third time period T3.

In the aforementioned operation of the conversion circuit CC according to an embodiment of the present invention, when a low level voltage is input to the first input terminal (clk), the conversion circuit may output a voltage of a level opposite to a level of the voltage of the third input terminal (in). When the high level voltage is input to the first input terminal (clk), the conversion circuit may maintain an output of a previous time period.

Referring again to FIG. 6, the waveform of FIG. 6 will now be described with reference to operations of the shift registers SR, the conversion circuits CC, the sampling latches SAL, and the holding latches HOL. First, the odd-numbered shift registers SR1, SR3, etc., may be charged with a voltage corresponding to the start signal SP or the sampling signal SAP of a previous stage during a low time period of the second clock signal CLK2. The odd-numbered shift registers SR1, SR3, etc., may output a low level voltage according to the start signal SP or the sampling signal SAP of the previous stage during a high time period of the second clock signal CLK2. The even-numbered shift registers SR2, SR4, etc., may be charged with a voltage corresponding to the sampling signal SAP of a previous stage charged during a low time period of the first clock signal CLK1. The even-numbered shift registers SR2, SR4, etc., may output a low level voltage according to the sampling signal SAP charged during a high time period of the first clock signal CLK1. Accordingly, as shown in FIG. 6, the shift registers SR1 to SRm may sequentially provide the sampling signals SAP1 to SAPm.

When the first clock signal CLK1 at a low level voltage is input to the odd-numbered conversion circuits CC1, CC3, etc., they may output a voltage having a level opposite to the input level. When the first clock signal CLK1 at a high level voltage is input to the odd-numbered conversion circuits CC1, CC3, etc., they may maintain an output of the previous time period. When the second clock signal CLK2 at a low level voltage is input to even-numbered conversion circuits CC2, CC4, etc., they may output a voltage having a level opposite to the input level. When the second clock signal CLK2 at a high level voltage is input to the even-numbered conversion circuits CC2, CC4, etc., they may maintain an output of the previous time period. Accordingly, when the conversion circuits CC1 to CCm sequentially receive the sampling signals SAP1 to SAPm as input signals, as shown in FIG. 6, they may sequentially provide the conversion signals CV1 to CVm.

When the sampling signals SAP1 to SAPm are provided to respective ones of the sampling latches SAL1 to SALm (low time period), they may each receive and charge data. When both of the supply of one of the sampling signals SAP 1 to SAPm and the supply of one of the conversion signals CV1 to CVm stop, the sampling latches SAL1 to SALm may output a voltage corresponding to the stored data.

When the first enable signal EN1 is at a low level and the second enable signal EN2 is at a high level, the holding latches HOL1 to HOLm may receive the data DATA from respective ones of the sampling latches SAL1 to SALm. When the first enable signal EN1 is at a high level and the second enable signal EN2 is at a low level, the holding latches HOL1 to HOLm may output a high or low level voltage to the data lines D1 to Dm, according to the data stored respectively therein. The low level voltage output to the data lines D1 to Dm may be provided to pixels 40 as the first data signal, and the high level voltage output to the data lines D1 to Dm may be provided to pixels 40 as the second data signal.

As described above, an embodiment of the present invention may provide a data driver 20 that may be used to digitally drive a display, and which may be formed using only PMOS transistors. In particular, since the data driver 20 according to an embodiment of the present invention may output the first or second data signal corresponding the data DATA, it may be applicable to a digital drive. Further, the data driver 20 may be formed on a panel, which may allow manufacturing cost to be reduced.

Figure 12:
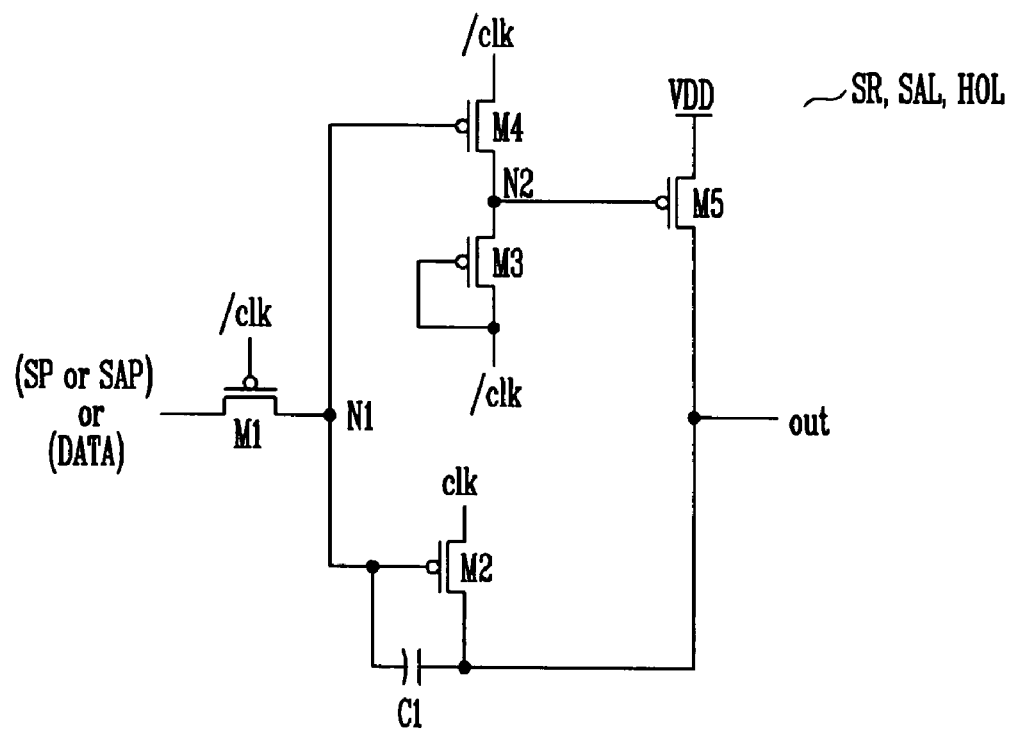
FIG. 12 illustrates a second embodiment of the shift register, sampling latch, and/or holding latch shown in FIG. 5.

FIG. 12 illustrates a second embodiment of the shift register, sampling latch, and/or holding latch shown in FIG. 5. In order to avoid repetition, a description of elements or components that may be substantially the same as those described above in connection with FIG. 7 will not be repeated.

Referring to FIG. 12, the gate electrode and the second electrode of the third transistor M3 may be connected to the second input terminal (/clk). Although the gate electrode and the second electrode of the third transistor M3 are connected to the second input terminal (/clk), an operation thereof may be as described above for the aforementioned shift registers SR and the latches SAL and HOL. In detail, the second electrode of the third transistor M3 in the shift register SR shown in FIG. 7 may be connected to the fourth power supply VSS. Accordingly, when the third transistor M3 is turned-on, a low level voltage may be provided to the gate electrode of the fifth transistor M5. In the same manner, in FIG. 12, when a low level signal is provided to the second input terminal (/clk) to turn-on the third transistor M3, a low level voltage may be provided to the gate electrode thereof.

Figure 13:
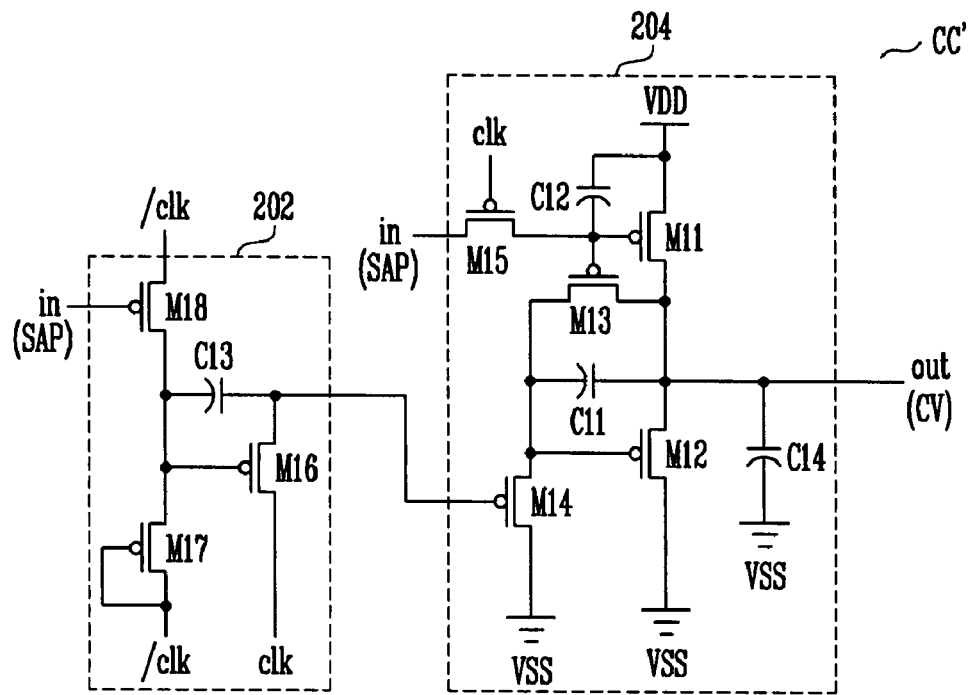
FIG. 13 illustrates a second embodiment of the conversion circuit shown in FIG. 10.

FIG. 13 illustrates a second embodiment 200' of the conversion circuit 200 shown in FIG. 10. In order to avoid repetition, a description of elements or components that may be substantially the same as those described above in connection with FIG. 10 will not be repeated. Referring to FIG. 13, the first electrode of an eighteenth transistor M18 in the input circuit 202 may be connected to the second input terminal (/clk). Thus, whereas the first electrode of the eighteenth transistor M18 in the first embodiment may be connected to the third power supply VDD, it may be connected to the second input terminal (/clk) in the second embodiment.

Hereinafter, operation of the conversion circuit 200 will be described with reference to FIGS. 11 and 13. First, the eighteenth transistor M18 may be turned-off according to a high level voltage provided to the third input terminal (in) during the first time period T1. Next, the eighteenth transistor M18 may be turned-on according to a low level voltage provided to the third input terminal (in) during the second time period T2. Further, during the second time period T2, a low level voltage may be provided to the second input terminal (/clk) to turn-on the seventeenth transistor M17. Accordingly, a low level voltage may be provided to a gate electrode of the sixteenth transistor M16 by turning on the seventeenth transistor M17 and the eighteenth transistor M18. At this time, the sixteenth transistor M16 may be turned-on, so that a high level voltage may be output by the input circuit 202.

In the second embodiment of the present invention, even if both of the seventeenth transistor M17 and the eighteenth transistor M18 are simultaneously turned-on during the second time period T2, it may receive a voltage from the second input terminal (/clk), thereby reducing power consumption. In the first embodiment of the present invention, when the seventeenth transistor M17 and the eighteenth transistor M18 are simultaneously turned-on, because the second input terminal (/clk) is connected to the third power supply VDD, power may be consumed. However, in the second embodiment of the present invention, the third power supply VDD may be omitted, which may reduce power consumption.

When a low level voltage is input to the second input terminal (/clk) during the third time period T3, the eighteenth transistor M18 may be turned-on and, when the eighteenth transistor M18 is turned-on, a high level voltage may be provided to the gate electrode of the sixteenth transistor M16. Accordingly, the first electrode of the sixteenth transistor M16 may not drop to less than a high level, and the fourteenth transistor M14 may be turned-off. During the fourth time period T4, a high level voltage may be input to the third input terminal (in) to turn off the eighteenth transistor M118.

As described above, the conversion circuit 200' according to the second embodiment of the present invention may operate in the same manner as in the conversion circuit 200 according to the first embodiment of the present invention shown in FIG. 10, and may further reduce power consumption when the seventeenth transistor M17 and the eighteenth transistor M18 are simultaneously turned-on.

Figure 14:
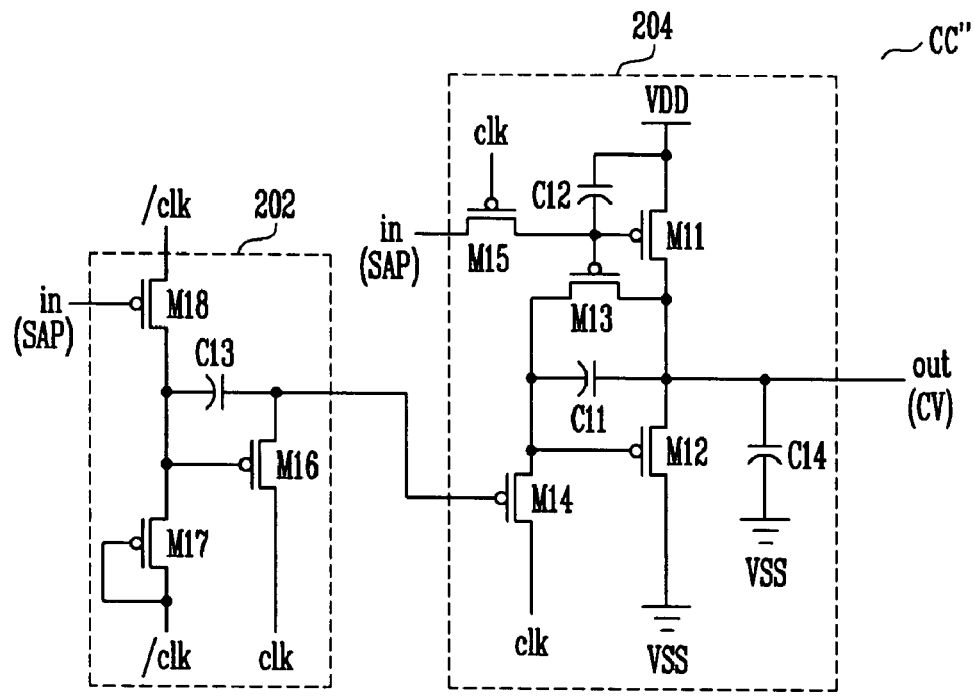
FIG. 14 illustrates a third embodiment of the conversion circuit shown in FIG. 10.

FIG. 14 illustrates a third embodiment 200" of the conversion circuit 200 shown in FIG. 10. In order to avoid repetition, a description of elements or components that may be substantially the same as those described above in connection with FIG. 10 will not be repeated. Referring to FIG. 14, the second electrode of the fourteenth transistor M14 in the output circuit 204 may be connected to the first input terminal (clk).

The operation of the conversion circuit 200" will be explained with reference to FIGS. 11 and 14. First, during the first time period T1, a low level voltage from the input circuit 202 may be provided to the fourteenth transistor M14, which may be turned on. At this time, because a low level voltage may be provided to the first input terminal (clk), a low level voltage may be provided to a gate electrode of the twelfth transistor M12, so that the twelfth transistor M12 may be turned-on. During the second time period T2, the third time period T3, and the fourth time period T4, a high level voltage from the input circuit 202 may be provided to the fourteenth transistor M14, thereby causing the fourteenth transistor M14 to be turned-off. Thus, the conversion circuit 200" according to the third embodiment of the present invention may operate in the same manner as the conversion circuit 200 according to the first embodiment of the present invention that is shown in FIG. 10.

Figure 15:
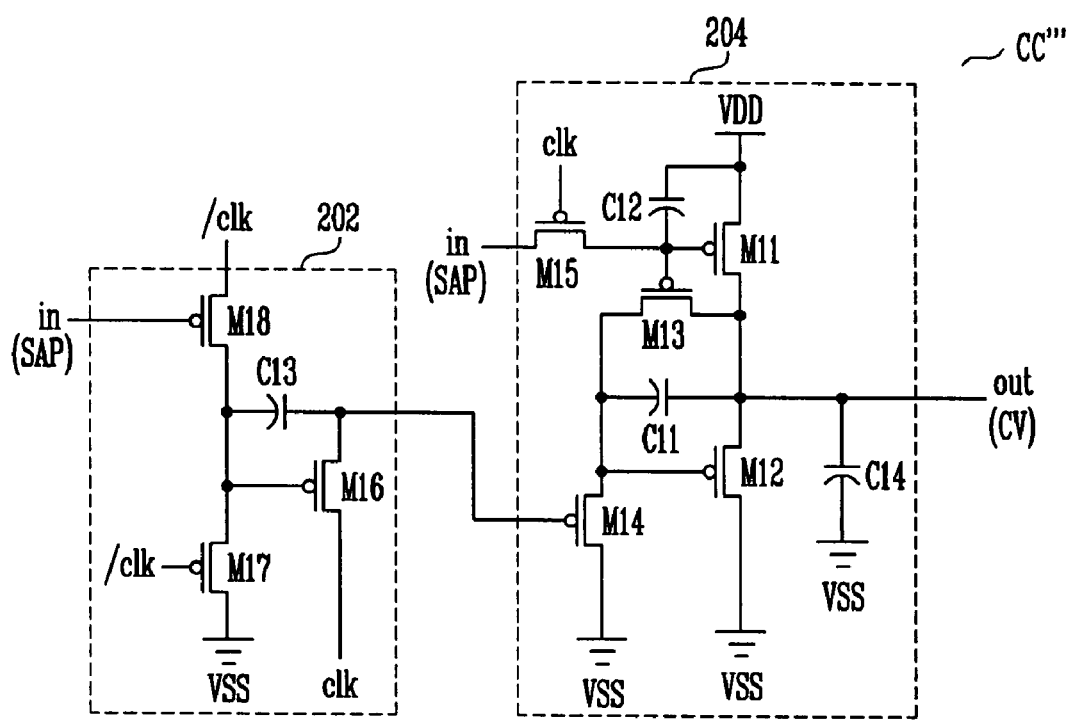
FIG. 15 illustrates a fourth embodiment of the conversion circuit shown in FIG. 10.

FIG. 15 illustrates a fourth embodiment 200''' of the conversion circuit shown in FIG. 10. In order to avoid repetition, a description of elements or components that may be substantially the same as those described above in connection with FIG. 10 will not be repeated. Referring to FIG. 15, the second electrode of a seventeenth transistor M17 in the input circuit 202 may be connected to the fourth power supply VSS. However, operation of the conversion circuit 200''' may be the same as that of the first embodiment.

Figure 16:
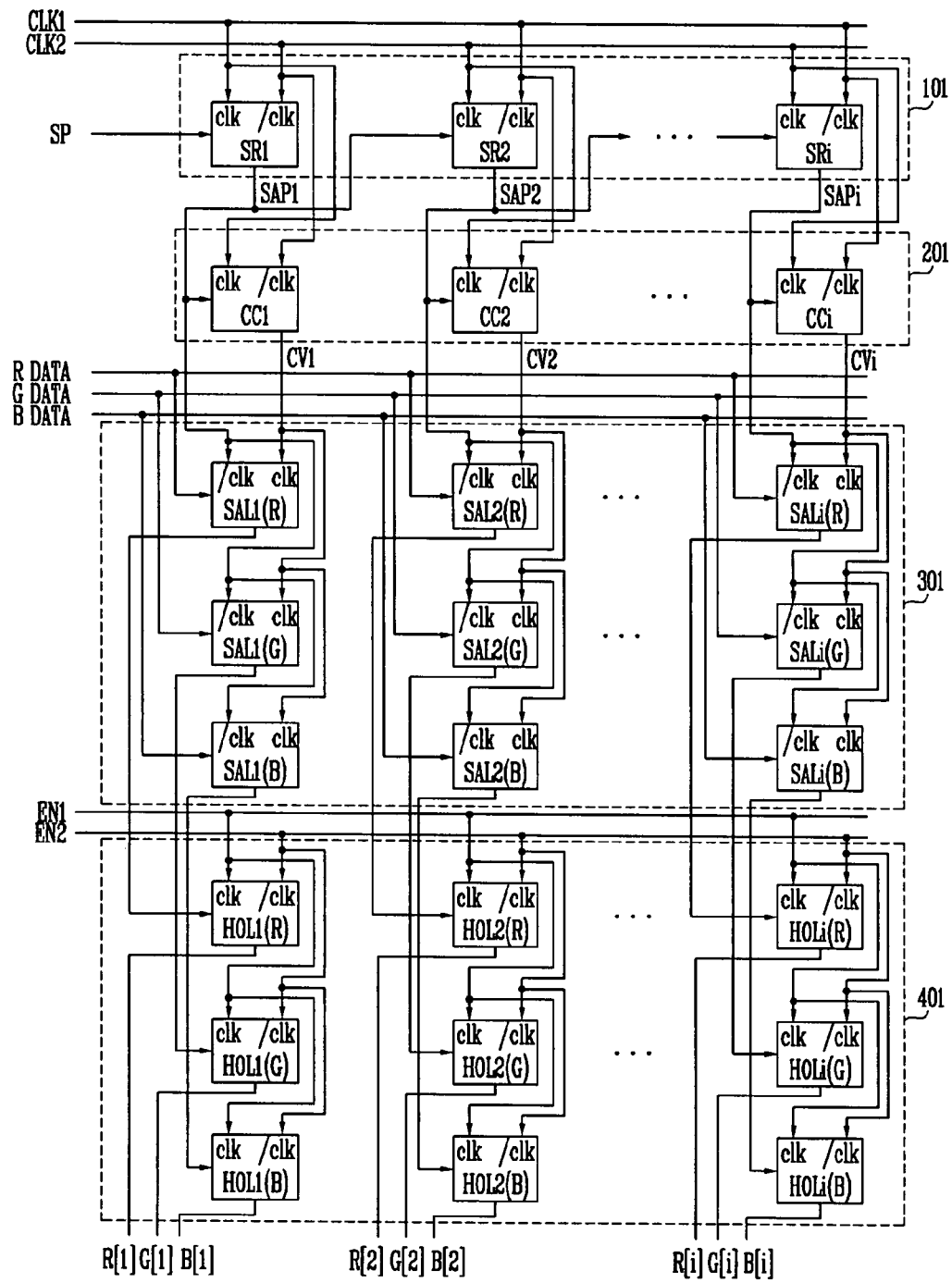
FIG. 16 illustrates another embodiment of the data driver shown in FIG. 1.

FIG. 16 illustrates another embodiment of the data driver shown in FIG. 1, in which red data R DATA, green data G DATA, and blue data B DATA may be simultaneously input. Thus, whereas the embodiment illustrated in FIG. 5 may be configured for sequential input of red, green, and blue data R DATA, G DATA, and B DATA, the embodiment illustrated in FIG. 16 may be configured for simultaneous input thereof.

Referring to FIG. 16, the shift register circuit 101 may include i shift registers SR1 to SRi, the conversion circuit 201 may include m conversion circuits CC1 to CCi, the sampling latch circuit 301 may include 3i sampling latches SAL SAL1 (R) to SAL i(B), and the holding latch circuit 401 may include 3i holding latches HOL1(R) to HOLi(B), where i is a positive integer.

The shift registers SR1 to SRi may have substantially the same construction the shift register SR shown in FIG. 7. Therefore, a detailed description thereof will not be repeated.

In operation, odd-numbered shift registers SR1, SR3, etc., may receive the first clock signal CLK1 through the first input terminal (clk) and may receive a second clock signal CLK2 through the second input terminal (/clk). Even-numbered shift registers SR2, SR4, etc., may receive the second clock signal CLK2 through the first input terminal CLK1 and may receive the first clock signal CLK1 through the second input terminal (/clk).

Among the shift registers SR1 to SRi, the first shift register SR1 may receive the first clock signal CLK1, the second clock signal CLK2, and the start signal SP, and may provide the first sampling signal SAP1. The second shift register SR2 may receive the first clock signal CLK1, the second clock signal CLK2, and the first sampling signal SAP1, and may provide the second sampling signal SAP2. These operations may be repeated for each of the remaining shift registers SR so that the shift registers SRi to SRi sequentially provide sampling signals SAP1 to SAP1 to the conversion circuits CC1 to CCi and the sampling latches SAL1(R) to SALi(B).

The conversion circuits CC1 to CCi may have substantially the same construction the conversion circuit CC shown in FIG. 10. Therefore, a detailed description thereof will not be repeated.

In operation, odd-numbered conversion circuits CC1, CC3, etc., may receive the first clock signal CLK1 through the first input terminal (clk) and may receive the second clock signal CLK2 through a second input terminal (/clk). Even-numbered conversion circuits CC2, CC4, etc., may receive the second clock signal CLK2 through the first input terminal (clk) and may receive the first clock signal CLK1 through the second input terminal (/clk).

The conversion circuits CC1 to CCi may receive the first clock signal CLK1, the second clock signal CLK2, and the sampling signal SAP, and may provide a conversion signal CV. Thus, the first conversion circuit CC1 may receive the first clock signal CLK1, the second clock signal CLK2, and the first sampling signal SAP 1, and may provide the first conversion signal CV1. The second conversion circuit CC2 may receive the first clock signal CLK1, the second clock signal CLK2, and the second sampling signal SAP2, and may provide the second conversion signal CV2.

The sampling latches SAL1(R) to SALi(B) may have substantially the same construction as the sampling latch SAL shown in FIG. 8. Therefore, a detailed description thereof will not be repeated.

In operation, the sampling latches SAL may receive the conversion signal CV through the first input terminal (clk), and may receive the sampling signal SAP through the second input terminal CLK2. When the sampling latches SAL receive the conversion signal CV and the sampling signal SAP, they may store and maintain data during a predetermined time period.

The sampling latches SAL may include red sampling latches SAL1(R) to SALi(R) for receiving red data R DATA, green sampling latches SAL1(G) to SALi(G) for receiving green data G DATA, and blue sampling latches SAL1(B) to SALi(B) for receiving blue data B DATA. Thus, when the sampling signal SAP and the conversion signal CV are provided to the red sampling latches SAL1(R) to SALi(R), they may receive and temporarily store red data R DATA, when the sampling signal SAP and the conversion signal CV are provided to the green sampling latches SAL1(G) to SALi(G), they may receive and temporarily store green data G DATA, and when the sampling signal SAP and the conversion signal CV are provided to the blue sampling latches SAL1(B) to SALi(B), they may receive and temporarily store blue data B DATA.

Respective ones of the red sampling latches SAL1(R) to SALi(R), the green sampling latches SAL1(G) to SALi(G), and the blue sampling latches SAL1(B) to SALi(B) may be grouped, such that the red sampling latch SAL(R), the green sampling latch SAL(G), and the blue sampling latch SAL(B) included in one group may each receive the same sampling signal SAP and the same conversion signal CV. Accordingly, the red sampling latch SAL(R), the green sampling latch SAL(G), and the blue sampling latch SAL(B) included in the one group may simultaneously receive data R DATA, G DATA, and B DATA. The number of sampling latches SAL may be three times the number of shift registers SR.

The holding latches HOL1(R) to HOLi(B) may have substantially the same construction as the holding latch HOL shown in FIG. 9. Therefore, a detailed description thereof will not be repeated.

In operation, the holding latches HOL may receive the second enable signal EN2 through the first input terminal (clk) and may receive the first clock enable signal EN1 through the second input terminal (/clk). When the holding latches HOL receive the first and second enable signals EN1 and EN2, they may simultaneously receive the red, green, and blue data R DATA, G DATA, and B DATA that are stored in the sampling latches SAL. In addition, the holding latches HOL may supply the first data signal or the second data signal according to polarities of the stored red, green and blue data R DATA, G DATA, and B DATA.

The holding latches HOL may include red holding latches HOL1(R) to HOLi(R) for receiving red data R Data, green holding latches HOL1(G) to HOLi(G) for receiving green data G Data, and blue holding latches HOL1(B) to HOLi(B) for receiving blue data B Data. In detail, the red holding latches HOL1(R) to HOLi(R) may receive red data R DATA from red sampling latches SAL1(R) to SALi(R). Similarly, the green holding latches HOL1(G) to HOLi(G) may receive green data G DATA from green sampling latches SAL1(G) to SALi(G). Similarly, the blue holding latches HOL1(B) to HOLi(B) may receive blue data B DATA from blue sampling latches SAL1(B) to SALi(B). The number of the holding latches HOL may be the same as the number of sampling latches SAL.

As described above, in the data driver and the OLED display using the same according to embodiments of the present invention, shift registers, sampling latches, holding latches, and conversion circuits included in the data driver may be constructed using only PMOS transistors. Accordingly, the data driver may be formed on a panel, which may allow manufacturing costs to be reduced. In addition, since the data driver may supply a first data signal or a second data signal as a data signal, it may be employed in an OLED display that is digitally driven.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A data driver, comprising:
a shift register circuit configured to receive a first clock signal, a second clock signal, and a start signal, and to sequentially provide a sampling signal;
a conversion circuit configured to receive the first clock signal, the second clock signal, and the sampling signal, and to sequentially provide a conversion signal;
a sampling latch circuit configured to receive the sampling signal from the shift register circuit and receive the conversion signal from the conversion circuit, and to store data according to the sampling signal and the conversion signal; and
a holding latch circuit configured to receive the data from the sampling latch circuit in response to first and second enable signals, and to provide a first data signal or a second data signal to data lines corresponding to the received data, wherein:
the shift register circuit includes a plurality of shift registers, the sampling latch circuit includes a plurality of sampling latches, and the holding latch circuit includes a plurality of holding latches, each of the shift registers, the sampling latches, and the holding latches including a same first circuit,
the first circuit includes a capacitor and first, second, third, fourth and fifth transistors,
a first electrode of the first transistor is connected to an external input, a gate electrode of the first transistor is connected to a second input, and a second electrode of the first transistor is connected to a first node,
a gate electrode of the second transistor is connected to the first node, a first electrode of the second transistor is connected to a first input, and a second electrode of the second transistor is connected to an output,
a first electrode of the third transistor is connected to a second node,
a gate electrode of the fourth transistor is connected to the first node, a first electrode of the fourth transistor is connected to the second input, and a second electrode of the fourth transistor is connected to the second node,
a gate electrode of the fifth transistor is connected to the second node, a first electrode of the fifth transistor is connected to a third power supply, and a second electrode of the fifth transistor is connected to the output, and a first electrode of the capacitor is connected to the gate electrode of the second transistor, and a second electrode of the capacitor is connected to the second electrode of the second transistor.

2. The data driver as claimed in claim 1, wherein:
the conversion circuit is configured to output a conversion signal having a level opposite to a level of the sampling pulse during a low level half-cycle of the first clock signal, and
the conversion circuit is configured to maintain the output conversion signal at a same level during a next high level half-cycle of the first clock signal.

3. The data driver as claimed in claim 1, wherein:
the sampling latch circuit includes a plurality of sampling latches, and
the sampling latches receive the data when the sampling signal received from the shift register circuit is supplied at a low level, and output the data when the supply of the sampling signal and the conversion signal stops.

4. The data driver as claimed in claim 1, wherein:
the sampling latch circuit includes a plurality of sampling latches,
the sampling latches are configured to store the data while the first enable signal is at a high level,
the holding latch circuit includes a plurality of holding latches, the number of holding latches being the same as the number of sampling latches,
the holding latches are configured to receive the data from the sampling latches when the first enable signal is at a low level, and
the holding latches are configured to provide the first data signal or the second data signal when the first enable signal is at a high level.

5. The data driver as claimed in claim 1, wherein:
the shift register circuit includes a plurality of shift registers,
the sampling latch circuit includes a plurality of sampling latches, and
the holding latch circuit includes a plurality of holding latches.

6. The data driver as claimed in claim 5, wherein transistors in the first circuit are all PMOS transistors.

7. The data driver as claimed in claim 5, wherein:
the number of sampling latches is three times the number of shift registers, and
the number of holding latches is three times the number of the shift registers.

8. The data driver as claimed in claim 7, wherein the sampling latches include:
red sampling latches configured to store red data,
green sampling latches configured to store green data, and
blue sampling latches configured to store blue data.

9. The data driver as claimed in claim 8, wherein:
one red sampling latch, one green sampling latch, and one blue sampling latch are configured as one group, and
a same sampling signal and a same conversion signal are provided to each of the red, green, and blue sampling latches of the one group.

10. The data driver as claimed in claim 8, wherein:
the holding latches include red holding latches configured to receive the red data from the red sampling latches,
the holding latches include green holding latches configured to receive the green data from the green sampling latches, and
the holding latches include blue holding latches configured to receive the blue data from the blue sampling latches.

11. The data driver as claimed in claim 1, wherein:
a gate electrode of the third transistor is connected to the second input, and a second electrode of the third transistor is connected to a fourth power supply.

12. The data driver as claimed in claim 11, wherein the first, second, third, fourth, and fifth transistors are PMOS transistors.

13. The data driver as claimed in claim 11, wherein:
the shift register circuit includes even and odd shift registers,
the first clock signal is provided to the first input of the odd shift registers,
the second clock signal is provided to the second input of the odd shift registers,
the first clock signal is provided to the second input of the even shift registers, and
the second clock signal is provided to the first input of the even shift registers.

14. The data driver as claimed in claim 11, wherein:
the shift registers are configured to charge the capacitor with a voltage corresponding to a voltage provided to the external input when a low level voltage is provided to the second input, and
the shift registers are configured to provide a voltage corresponding to the voltage charged in the capacitor to the output when a high level voltage is provided to the second input.

15. The data driver as claimed in claim 11, wherein:
the sampling signal is provided to the second input of the sampling latches, and
the conversion signal is provided to the first input of the sampling latches.

16. The data driver as claimed in claim 1, wherein:
a second electrode of the third transistor is connected to a gate electrode of the third transistor.

17. The data driver as claimed in claim 1, wherein:
the conversion circuit includes an input circuit connected to an output circuit,
the input circuit is configured to control a voltage provided to the output circuit in correspondence with the sampling signal, and
the output circuit is configured to control output of the conversion signal in correspondence with the sampling signal and the voltage provided by the input circuit.

18. The data driver as claimed in claim 17, wherein transistors in the input circuit and the output circuit are all PMOS transistors.

19. The data driver as claimed in claim 17, wherein:
the output circuit includes an eleventh capacitor, a twelfth capacitor, and eleventh, twelfth, thirteenth, fourteenth and fifteenth transistors,
a gate electrode of the eleventh transistor is connected to a third power supply, and a second electrode of the eleventh transistor is connected to an output,
a gate electrode of the twelfth transistor is connected to the output, and a second electrode of the twelfth transistor is connected to a fourth power supply,
a gate electrode of the thirteenth transistor is connected to a gate electrode of the eleventh transistor, and a first electrode of the thirteenth transistor is connected to the second electrode of the eleventh transistor,
a first electrode of the fourteenth transistor is connected to the second electrode of the thirteenth transistor, a second electrode of the fourteenth transistor is connected to the fourth power supply, and a gate electrode of the fourteenth transistor is connected to the input circuit, a first electrode of the fifteenth transistor is connected to a third input, a second electrode of the fifteenth transistor is connected to the gate electrode of the eleventh transistor, and a gate electrode of the fifteenth transistor is connected to the first input, a first electrode of the twelfth capacitor is connected to the gate electrode of the eleventh transistor, and a second electrode of the twelfth capacitor is connected to the first electrode of the eleventh transistor, and a first electrode of the eleventh capacitor is connected to the gate electrode of the twelfth transistor, and a second electrode of the eleventh capacitor is connected to the first electrode of the twelfth transistor.

20. The data driver as claimed in claim 19, further comprising a fourteenth capacitor, wherein a first electrode of the fourteenth capacitor is connected to the output, and a second electrode of the fourteenth capacitor is connected to the fourth power supply.

21. The data driver as claimed in claim 19, wherein:
the input circuit includes a thirteenth capacitor and sixteenth, seventeenth, and eighteenth transistors,
a first electrode of the sixteenth transistor is connected to a gate electrode of the fourteenth transistor, and a second electrode of the sixteenth transistor is connected to the first input,
a first electrode of the seventeenth transistor is connected to a gate electrode of the sixteenth transistor, and a gate electrode and a second electrode of the seventeenth transistor are connected to a second input,
a gate electrode of the eighteenth transistor is connected to the third input, a first electrode of the eighteenth transistor is connected to the third power supply, and a second electrode of the eighteenth transistor is connected to the gate electrode of the sixteenth transistor, and
a first electrode of the thirteenth capacitor is connected to the gate electrode of the sixteenth transistor, and a second electrode of the thirteenth capacitor is connected to the first electrode of the sixteenth transistor.

22. The data driver as claimed in claim 21, wherein the eleventh, twelfth, thirteenth, fourteenth, fifteenth, sixteenth, seventeenth, and eighteenth transistors are PMOS transistors.

23. The data driver as claimed in claim 21, wherein:
the conversion circuit includes even and odd conversion circuits,
the first clock signal is provided to the first input of the odd conversion circuits,
the second clock signal is provided to the second input of the odd conversion circuits,
the first clock signal is provided to the second input of odd conversion circuits, and
the second clock signal is provided to the first input of odd conversion circuits.

24. The data driver as claimed in claim 19, wherein:
the input circuit includes a thirteenth capacitor and sixteenth, seventeenth, and eighteenth transistors,
a first electrode of the sixteenth transistor is connected to a gate electrode of the fourteenth transistor, and a second electrode of the sixteenth transistor is connected to the first input,
a first electrode of the seventeenth transistor is connected to a gate electrode of the sixteenth transistor, and a gate electrode and a second electrode of the seventeenth transistor are connected to a second input,
a gate electrode of the eighteenth transistor is connected to the third input, a first electrode of the eighteenth transistor is connected to the second input, and a second electrode of the eighteenth transistor is connected to the gate electrode of the sixteenth transistor, and a first electrode of the thirteenth capacitor is connected to the gate electrode of the sixteenth transistor, and a second electrode of the thirteenth capacitor is connected to the first electrode of the sixteenth transistor.

25. The data driver as claimed in claim 19, wherein:
the input circuit includes a thirteenth capacitor and sixteenth, seventeenth, and eighteenth transistors,
a first electrode of the sixteenth transistor is connected to a gate electrode of the fourteenth transistor, and a second electrode of the sixteenth transistor is connected to the first input,
a first electrode of the seventeenth transistor is connected to a gate electrode of the sixteenth transistor, a second electrode of the seventeenth transistor is connected to the fourth power supply, and a gate electrode of the seventeenth transistor is connected to a second input,
a gate electrode of the eighteenth transistor is connected to the third input, a first electrode of the eighteenth transistor is connected to the second input, and a second electrode of the eighteenth transistor is connected to the gate electrode of the sixteenth transistor, and
a first electrode of the thirteenth capacitor is connected to the gate electrode of the sixteenth transistor, and a second electrode of the thirteenth capacitor is connected to the first electrode of the sixteenth transistor.

26. An Organic Light Emitting Diodes Display driven in a digital manner, comprising:
a scan driver for sequentially providing a scan signal to scan lines;
a data driver for providing a first data signal or a second data signal to data lines; and
pixels being selected in response to the scan signal, for receiving the first data signal or the second data signal to control emission or non-emission of light,
wherein the data driver includes:
a shift register circuit including shift registers formed of PMOS transistors, the shift register circuit being configured to receive a first clock signal, a second clock signal, and a start signal, and to sequentially provide a sampling pulse;
a conversion circuit including conversion circuits formed of PMOS transistors, the conversion circuit being configured to receive the first clock signal, the second clock signal, and the sampling pulse, and to sequentially generate a conversion signal;
a sampling latch circuit including sampling latches formed of PMOS transistors, the sampling latch circuit being configured to receive the sampling pulse from the shift register circuit and receive the conversion signal from the conversion circuit, and to store data according to the sampling pulse and the conversion signal; and
a holding latch circuit including holding latches, the holding latch circuit being configured to receive the data from the sampling latch circuit in response to first and second enable signals, and to provide the first data signal or the second signal to the data lines, wherein:
the shift register circuit includes a plurality of shift registers, the sampling latch circuit includes a plurality of sampling latches, and the holding latch circuit includes a plurality of holding latches, each of the shift registers, the sampling latches, and the holding latches including a same first circuit,
the first circuit includes a capacitor and first, second, third, fourth and fifth transistors, a first electrode of the first transistor is connected to an external input, a gate electrode of the first transistor is connected to a second input, and a second electrode of the first transistor is connected to a first node, a gate electrode of the second transistor is connected to the first node, a first electrode of the second transistor is connected to a first input, and a second electrode of the second transistor is connected to an output, a first electrode of the third transistor is connected to a second node, a gate electrode of the fourth transistor is connected to the first node, a first electrode of the fourth transistor is connected to the second input, and a second electrode of the fourth transistor is connected to the second node, a gate electrode of the fifth transistor is connected to the second node, a first electrode of the fifth transistor is connected to a third power supply, and a second electrode of the fifth transistor is connected to the output, and a first electrode of the capacitor is connected to the gate electrode of the second transistor, and a second electrode of the capacitor is connected to the second electrode of the second transistor.

* * * * *